United States Patent
Park

(10) Patent No.: US 10,481,729 B2
(45) Date of Patent: Nov. 19, 2019

(54) INPUT SENSING UNIT AND DISPLAY DEVICE HAVING THE SAME

(71) Applicant: Samsung Display Co., Ltd., Yongin-si (KR)

(72) Inventor: Sung Hyun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 4 days.

(21) Appl. No.: 15/978,181

(22) Filed: May 13, 2018

(65) Prior Publication Data

US 2019/0074328 A1    Mar. 7, 2019

(30) Foreign Application Priority Data

Sep. 1, 2017  (KR) .................. 10-2017-0112085

(51) Int. Cl.

| G06F 3/041 | (2006.01) |
|---|---|
| G06F 3/044 | (2006.01) |
| G06F 3/047 | (2006.01) |
| G02F 1/1345 | (2006.01) |
| G02F 1/1333 | (2006.01) |
| G02F 1/1362 | (2006.01) |
| H01L 27/32 | (2006.01) |

(52) U.S. Cl.
CPC ........ *G06F 3/04164* (2019.05); *G02F 1/1345* (2013.01); *G06F 3/044* (2013.01); *G06F 3/047* (2013.01); *G06F 3/0446* (2019.05); *H01L 27/323* (2013.01); *G02F 1/1333* (2013.01); *G02F 1/133305* (2013.01); *G02F 1/136286* (2013.01); *G02F 2001/13629* (2013.01); *G02F 2001/133388* (2013.01); *G06F 3/0412* (2013.01); *G06F 2203/04102* (2013.01); *G06F 2203/04103* (2013.01); *G06F 2203/04112* (2013.01)

(58) Field of Classification Search
CPC . G06F 2203/04102; G06F 2203/04112; G06F 2203/04103; G06F 3/044; G06F 3/047; G06F 3/0412; G06F 3/0446; G06F 3/04164; H01L 27/323; G02F 1/1333; G02F 1/13338; G02F 1/1345; G02F 1/13452; G02F 1/13458; G02F 1/136286; G02F 1/13629; G02F 1/136295; G02F 1/133305; G02F 2001/133388; G02F 2001/13629

See application file for complete search history.

(56) References Cited

U.S. PATENT DOCUMENTS

| 9,240,297 | B2* | 1/2016 | Lee .................. G06F 3/044 |
|---|---|---|---|
| 9,490,312 | B2 | 11/2016 | Lee et al. |
| 2007/0052895 | A1* | 3/2007 | Chen ................ G02F 1/1345 349/139 |
| 2008/0157364 | A1* | 7/2008 | Yang ................ G02F 1/1345 257/741 |
| 2011/0025639 | A1* | 2/2011 | Trend ................ G06F 3/044 345/174 |

(Continued)

FOREIGN PATENT DOCUMENTS

KR    10-2016-0020987    2/2016

*Primary Examiner* — Darlene M Ritchie
(74) *Attorney, Agent, or Firm* — H.C. Park & Associates, PLC

(57) ABSTRACT

An input sensing unit designed to make it possible to prevent a failure due to a foreign substance, and a display device having the input sensing unit.

36 Claims, 18 Drawing Sheets

(56) References Cited

U.S. PATENT DOCUMENTS

| | | | | |
|---|---|---|---|---|
| 2011/0102370 A1* | 5/2011 | Kono | ............... | G06F 3/044 345/174 |
| 2012/0313905 A1* | 12/2012 | Kang | ............... | G02F 1/1345 345/204 |
| 2014/0253495 A1* | 9/2014 | Kang | ............... | G06F 3/044 345/174 |
| 2015/0187803 A1* | 7/2015 | Moh | ............... | H01L 27/124 257/43 |
| 2016/0035747 A1* | 2/2016 | Zhang | ............... | G02F 1/1345 257/72 |
| 2016/0048248 A1 | 2/2016 | Na et al. | | |
| 2016/0328070 A1* | 11/2016 | Lin | ............... | G06F 3/0416 |
| 2017/0123565 A1 | 5/2017 | Li | | |

* cited by examiner

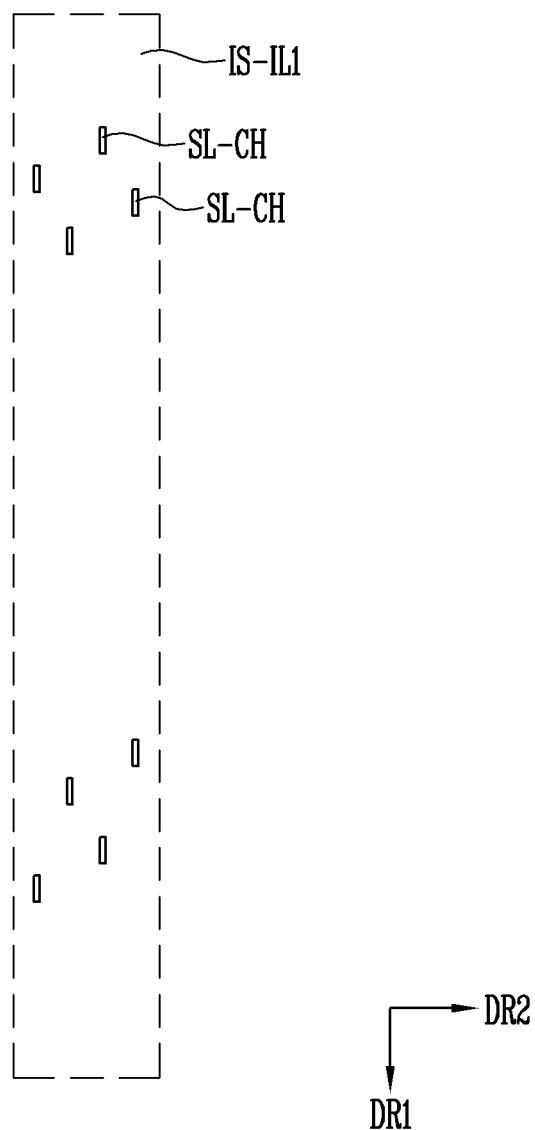

INPUT SENSING UNIT AND DISPLAY DEVICE HAVING THE SAME

CROSS-REFERENCE TO RELATED APPLICATION

The application claims priority from and the benefit of Korean Patent Application No. 10-2017-0112085, filed on Sep. 1, 2017, which is hereby incorporated by reference for all purposes as if fully set forth herein.

BACKGROUND

Field

Exemplary embodiments of the invention relate generally to an input sensing unit and a display device having the same.

Discussion of the Background

Recent display devices are being developed with the aim of having an information input function as well as an image display function. The information input function of display devices may be generally embodied in the form of an input sensing unit configured to receive touches of a user.

The input sensing unit may be attached to one surface of a display panel, which implements an image display function, or may be integrally provided with the display panel. The user may watch an image displayed on the display panel and press or touch the input sensing unit to input information.

The above information disclosed in this Background section is only for understanding of the background of the inventive concepts, and, therefore, it may contain information that does not constitute prior art.

SUMMARY

Exemplary embodiments of the inventive concepts are directed to an input sensing unit having improved reliability, and a display device having the input sensing unit.

Additional features of the inventive concepts will be set forth in the description which follows, and in part will be apparent from the description, or may be learned by practice of the inventive concepts.

An exemplary embodiment of the inventive concepts discloses an input sensing unit including: sensing electrodes and a plurality of signal lines coupled to the sensing electrodes and arranged at positions spaced apart from each other. One signal line of the plurality of signal lines may include disconnected metal patterns arranged at positions spaced apart from each other in a direction intersecting a direction in which the signal lines are arranged and spaced apart from each other. Each of the metal patterns of the one signal line of the plurality of signal lines may overlap a spacing part between metal patterns of another signal line adjacent to the one signal line with respect to the direction in which the signal lines are arranged and spaced apart from each other.

The metal pattern of the one signal line may not overlap a metal pattern of the adjacent signal line in the direction in which the signal lines are arranged and spaced apart from each other, and may overlap the spacing part of the adjacent signal line.

The metal pattern of the one signal line may partially overlap a metal pattern of the adjacent signal line in the direction in which the signal lines are arranged and spaced apart from each other, and may overlap the spacing part of the adjacent signal line.

The metal pattern of the one signal line partially overlaps a metal pattern of the adjacent signal line in the direction in which the signal lines are arranged and spaced apart from each other, and overlaps the spacing part of the adjacent signal line, a portion of the metal pattern of the one signal line that overlaps the metal pattern of the adjacent signal line may be smaller than a portion of the metal pattern of the one signal line that overlaps the spacing part of the adjacent signal line.

A length of each of the metal patterns may be equal to or greater than a length of the spacing part between the metal patterns.

A length of each of the metal patterns may be less than a length of the spacing part between the metal patterns.

Each of the metal patterns may have a rounded end.

The input sensing unit may further include an insulating part. Each of the signal lines may include a first line and a second line that are disposed to overlap each other with the insulating part interposed therebetween.

The second line may include a conductive line having an integrated structure and be electrically coupled to the first line through a contact hole that is formed in the insulating part at a position at which the second line overlaps a metal pattern of the first line.

The second line may include metal patterns spaced apart from each other. Each of the metal patterns of the second line may overlap corresponding spaced metal patterns of the first line and be electrically coupled to the first line through contact holes of the insulating part at positions at which the metal pattern of the second line overlaps the metal patterns of the first line.

The metal pattern of the second line may be longer than a spacing part formed between the metal patterns of the first line.

The contact hole may be formed adjacent to an end of the metal pattern.

The second line may be disposed over the first line. A thickness of a metal pattern of the second line may be greater than a thickness of a metal pattern of the first line.

A width of a longer one of the signal lines may be greater than a width of a shorter one of the signal lines.

The input sensing unit may further include a bent part having a predetermined curvature in at least a portion thereof. Each of the signal lines disposed in the bent part may be formed of only a metal pattern or only a spacing part so that only one of the metal pattern and the spacing part of each of the signal lines is provided in the bent part.

Each of the sensing electrodes may include a mesh pattern.

The sensing electrode may include: a first sensing electrode extending in a first direction; and a second sensing electrode extending in a second direction intersecting the first direction. The first sensing electrode may include a plurality of first sensors arranged in the first direction, and a first connector coupling the first sensors to each other. The second sensing electrode may include a plurality of second sensors arranged in the second direction, and a second connector coupling the second sensors to each other. The first sensors and the second sensors may be disposed on the same layer or different layers. One of the first connectors and the second connectors may be disposed on the same layer with the first sensors.

Another exemplary embodiment of the inventive concepts discloses a display device including: a display panel including a display area and a non-display area disposed around the display area; and an input sensing unit provided on the display panel. The input sensing unit may include: sensing electrodes and a plurality of signal lines coupled to the sensing electrodes and arranged at positions spaced apart from each other. One signal line of the plurality of signal lines may include disconnected metal patterns arranged at positions spaced apart from each other in a direction intersecting a direction in which the signal lines are arranged and spaced apart from each other. Each of the metal patterns of the one signal line of the plurality of signal lines may overlap a spacing part between metal patterns of another signal line adjacent to the one signal line with respect to the direction in which the signal lines are arranged and spaced apart from each other.

The display panel may include: a base layer; a light-emitting element provided over the base layer; and an encapsulation layer covering the light-emitting element and formed of one or more layers.

The metal pattern of the one signal line may not overlap a metal pattern of the adjacent signal line in the direction in which the signal lines are arranged and spaced apart from each other, and may overlap the spacing part of the adjacent signal line.

The metal pattern of the one signal line may partially overlap a metal pattern of the adjacent signal line in the direction in which the signal lines are arranged and spaced apart from each other, and may overlap the spacing part of the adjacent signal line.

When the metal pattern of the one signal line partially overlaps a metal pattern of the adjacent signal line in the direction in which the signal lines are arranged and spaced apart from each other, and overlaps the spacing part of the adjacent signal line, a portion of the metal pattern of the one signal line that overlaps the metal pattern of the adjacent signal line may be smaller than a portion of the metal pattern of the one signal line that overlaps the spacing part of the adjacent signal line.

A length of each of the metal patterns may be greater than a length of the spacing part between the metal patterns.

A length of each of the metal patterns may be equal to or less than a length of the spacing part between the metal patterns.

Each of the metal patterns may have a rounded end.

The display device may further include an insulating part. Each of the signal lines may include a first line and a second line that are disposed to overlap each other with the insulating part interposed therebetween.

The second line may include a conductive line having an integrated structure and be electrically coupled to the first line through a contact hole that is formed in the insulating part at a position at which the second line overlaps a metal pattern of the first line.

The second line may include metal patterns spaced apart from each other. Each of the metal patterns of the second line may overlap corresponding spaced metal patterns of the first line and be electrically coupled to the first line through contact holes of the insulating part at positions at which the metal pattern of the second line overlaps the metal patterns of the first line.

The metal pattern of the second line may be longer than a spacing part formed between the metal patterns of the first line.

The contact hole may be formed adjacent to an end of the metal pattern.

The second line may be disposed over the first line. A thickness of a metal pattern of the second line may be greater than a thickness of a metal pattern of the first line.

A width of a longer one of the signal lines may be greater than a width of a shorter one of the signal lines.

The display device may further include a bent part having a predetermined curvature in at least a portion thereof. Each of the signal lines disposed in the bent part may be formed of only a metal pattern or only a spacing part so that only one of the metal pattern and the spacing part of each of the signal lines is provided in the bent part.

Each of the sensing electrodes may include a mesh pattern.

The sensing electrode may include: a first sensing electrode extending in a first direction; and a second sensing electrode extending in a second direction intersecting the first direction. The first sensing electrode may include a plurality of first sensors arranged in the first direction, and a first connector coupling the first sensors to each other. The second sensing electrode may include a plurality of second sensors arranged in the second direction, and a second connector coupling the second sensors to each other. The first sensors and the second sensors may be disposed on the same layer or different layers. One of the first connectors and the second connectors may be disposed on the same layer with the first sensors.

Another exemplary embodiment of the inventive concepts discloses an input sensing unit provided on a display panel, the input sensing unit including: a sensing electrode; a signal line coupled to the sensing electrode; and an insulating part disposed over the display panel to overlap the display panel. The signal line may include at least two line parts each of which includes a first line and a second line with an insulating part interposed therebetween, the first and second line being electrically coupled to each other through a contact hole of the insulating part. Each of the line parts may extend in a first direction, and the line parts adjacent to each other may be arranged and spaced apart from each other in a second direction intersecting the first direction. Each of the line parts may include metal patterns oriented in the first direction, and a spacing part suitable for spacing the adjacent metal patterns apart from each other in the first direction. Each of the metal patterns may at least partially overlap a spacing part of a line part that is adjacent, in the second direction, to the line part including the metal pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 13A, FIG. 13B, and FIG. 13C are plan views illustrating respective layers of region FF1 of the input sensing unit shown in FIG. 8.

DETAILED DESCRIPTION OF THE ILLUSTRATED EMBODIMENTS

Figure 1:
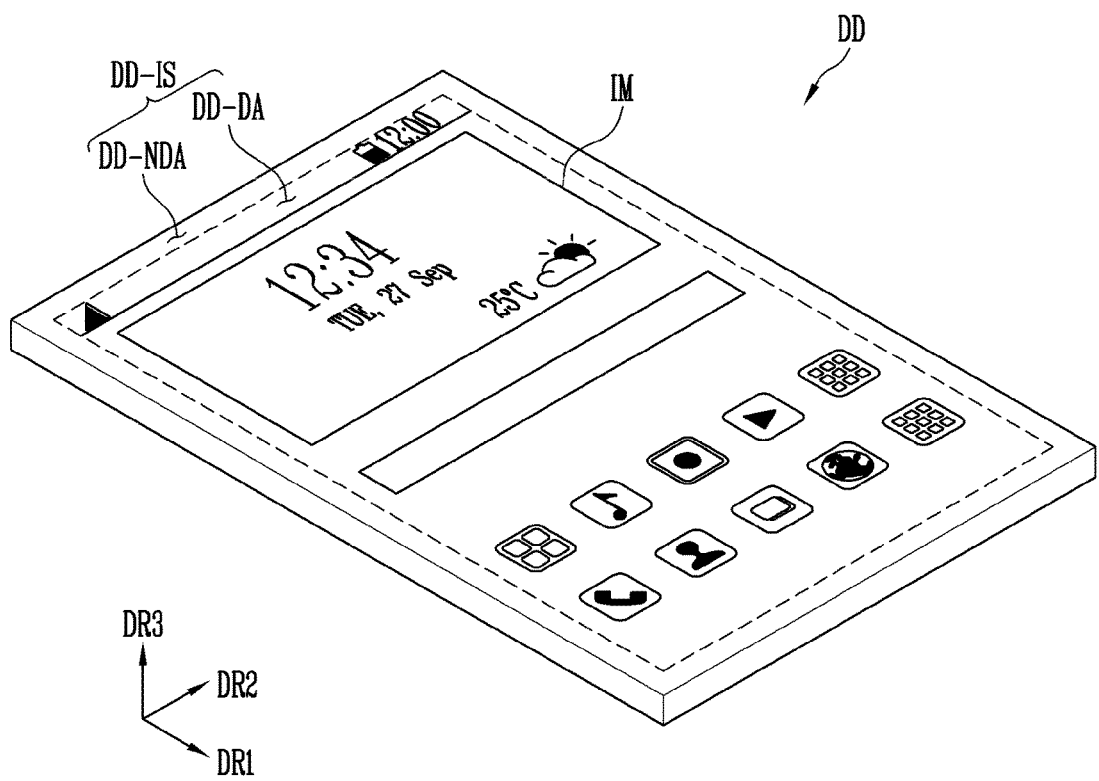
FIG. 1 is a perspective view illustrating a display device in accordance with an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, exemplary embodiments of the present disclosure will be described in detail with reference to the accompanying drawings.

FIG. 1 is a perspective view illustrating a display device DD in accordance with an exemplary embodiment of the inventive concepts. Referring to FIG. 1, the display device DD may display an image IM on a display surface DD-IS. The display surface DD-IS may be parallel to a plane defined by a first directional axis DR1 and a second directional axis DR2. A normal direction of the display surface DD-IS, i.e., a thickness direction of the display device DD, may be indicated by a third directional axis DR3.

A front surface (or an upper surface) and a rear surface (or a lower surface) of each of elements or units, which will be described herein below, may be defined based on the third directional axis DR3. However, the first to third directional axes DR1, DR2, and DR3 shown in the embodiments of the inventive concepts are only exemplary, and directions indicated by the first to third directional axes DR1, DR2, and DR3 are relative concepts and may be changed. Hereinafter, first to third directions are directions indicated by the first to third directional axes DR1, DR2, and DR3, respectively, and will be designated by the same reference characters as those of the first to third directional axes DR1, DR2, and DR3, respectively.

The display device DD shown in FIG. 1 may include a planar display surface. However, the inventive concepts are not limited to this, and the display device DD in accordance with an exemplary embodiment may include one of various display surfaces, e.g., a curved display surface or a three-dimensional display surface. In the case where the display device DD in an exemplary embodiment has a three-dimensional display surface, for example, the three-dimensional display surface may include a plurality of display areas oriented in respective different directions. The three-dimensional display surface may be embodied in the form of a polygonal-column-shaped display surface.

The display device DD in accordance with an exemplary embodiment may be a flexible display device. The inventive concepts are not limited thereto, and the display device DD may be a rigid display device.

The display device DD illustrated in FIG. 1 may be applied to a cellular phone terminal, for example. Although not shown, the display device DD of FIG. 1 may form a cellular phone by disposing electronic modules, a camera module, a power supply module, and so forth, which are mounted on a main board, along with the display device DD, on/in a bracket/casing or the like. The display device DD in accordance with an exemplary embodiment may be applied not only to large electronic devices such as a television, monitor, and an electronic display board, but also to small and medium electronic devices such as a tablet PC, a vehicle navigation apparatus, a game console, and a smartwatch.

As shown in FIG. 1, the display surface DD-IS of the display device DD may include a display area DD-DA on which an image IM is displayed, and a non-display area DD-NDA formed adjacent to the display area DD-DA. The non-display area DD-NDA is an area on which an image is not displayed. The non-display area DD-NDA may be disposed outside the display area DD-DA.

The display surface DD-IS of the display device DD may be rectangular. In this case, the non-display area DD-NDA may enclose the four sides of the rectangular display area DD-DA. The present disclosure is not limited to this. The display surface DD-IS of the display device DD in accordance with an exemplary embodiment may have various shapes, e.g., a polygonal shape such as a triangular shape, or a pentagonal shape, or a circular shape, so long as it can display the image IM. The display area DD-DA and the shape of the non-display area DD-NDA may be designed to have shapes corresponding to each other.

Figure 2:
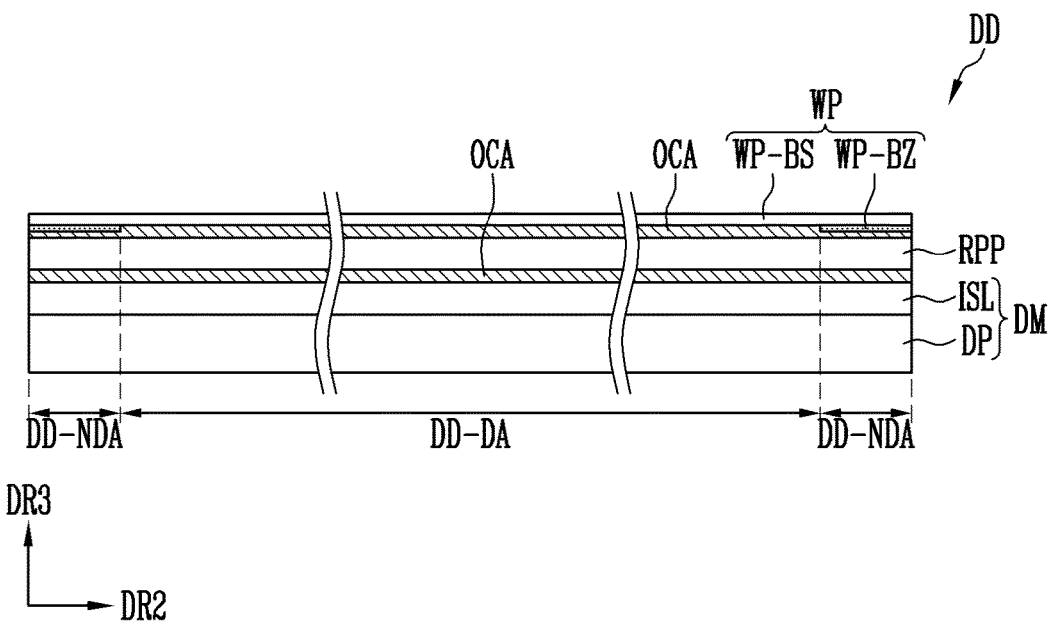
FIG. 2 is a sectional view illustrating the display device in accordance with an exemplary embodiment of the inventive concepts.

FIG. 2 is a sectional view schematically illustrating the display device DD in accordance with an exemplary embodiment. FIG. 2 is a sectional view of the display device DD taken along a plane defined by the second directional axis DR2 and the third directional axis DR3. FIG. 2 is a schematic view for explaining a stacking relationship of functional panels and/or functional units that form the display device DD.

Referring to FIG. 2, the display device DD in accordance with an exemplary embodiment may include a display panel, an input sensing unit, a reflection prevention unit, and a window unit. At least some components of the display panel, the input sensing unit, the reflection prevention unit, and the window unit may be formed through a continuous process, or at least some components may be coupled to each other by an adhesive member. The adhesive member may include a typical adhesive or temporary adhesive. For example, the adhesive member shown in FIG. 2 may be an optically clear adhesive member OCA.

In an exemplary embodiment, the input sensing unit may sense a touch or an input using an external medium, such as a hand or a pen, on the display surface DD-IS of the display device DD.

In an exemplary embodiment, the reflection prevention unit and the window unit may be replaced with other components or omitted.

In FIG. 2, among the input sensing unit, the reflection prevention unit, and the window unit, a component formed with another component through a continuous process may be expressed as "layer". Among the input sensing unit, the reflection prevention unit and the window unit, a component coupled to another component by an adhesive member may be expressed as "panel". Although "panel" may include a base layer, e.g., a synthetic resin film, a composite material film, or a glass substrate, for providing a base surface, "layer" may be provided without a separate base layer. In other words, the units expressed as "layers" may be disposed on base surfaces provided by other units.

The input sensing unit, the reflection prevention unit, and the window unit may be referred to as an input sensing panel ISP, a reflection prevention panel RPP, and a window panel WP, or as an input sensing layer ISL, a reflection prevention layer RPL, and a window layer WL, depending on whether a base layer is present or not.

As shown in FIG. 2, the display device DD in accordance with an embodiment of the present disclosure may include a display panel DP, an input sensing layer ISL, a reflection prevention panel RPP, and a window panel WP.

The input sensing layer ISL, which is the input sensing unit, may be directly disposed on the display panel DP. In this specification, the words "component B is directly disposed on component A" mean that there is no separate adhesive layer/member between component A and component B. Component B may be formed on a base surface provided by component A through a continuous process after component A has been formed. Therefore, the input sensing layer ISL of FIG. 2, which is directly disposed on the display panel DP, may be formed through a continuous process with one surface of the display panel DP as a base surface thereof without a separate adhesive layer/member.

A combination of the displayer panel DP and the input sensing layer ISL that is directly disposed on the display panel DP may be defined as a display module DM. Optically clear adhesive members OCA may be respectively disposed between the display module DM and the reflection prevention panel RPP and between the reflection prevention panel RPP and the window panel WP. In other words, one optically clear adhesive member OCA may be disposed between the display module DM and the reflection prevention panel RPP so that the reflection prevention panel RPP adheres to the display module DM. The other optically clear adhesive member OCA may be disposed between the reflection prevention panel RPP and the window panel WP so that they adhere to each other.

Similar to glass, the optically clear adhesive member OCA may transmit light by 97% or more. Therefore, the optically clear adhesive member OCA may enhance the clarity of the display surface DD-IS, compared to that of the case where typical double-sided adhesive tape is used.

The input sensing layer ISL may acquire coordinate information of an external input (e.g., a touch event) on the display surface DD-IS of the display device DD. The input sensing layer ISL may be disposed in or on the display panel DP.

Although not shown, the display module DM in accordance with an exemplary embodiment may further include a protective member disposed on a lower surface of the display panel DP. The protective member and the display panel DP may be coupled to each other by an adhesive member.

The display panel DP in accordance with an exemplary embodiment of the inventive concepts is not limited to a particular panel and, for example, the display panel DP may be a light-emitting display panel. In detail, for instance, the display panel DP may be an organic light-emitting display panel or a quantum dot light-emitting display panel. An emission layer of the organic light-emitting display panel may include organic light-emitting material. An emission layer of the quantum dot light-emitting display panel may include quantum dots and quantum rods. Hereinafter, the display panel DP will be explained as an organic light-emitting display panel.

The reflection prevention panel RPP may reduce reflectivity of external light that is incident from an upper surface of the window panel WP. External light that is incident into the display device DD may be reflected by an internal component of the display device DD, particularly, by a thin film transistor (TFT) or an electrode in the display panel DP, and then exit the display device DD. Because of such reflection of external light, the outdoor visibility may be reduced, and the reflective color characteristics may deteriorate. The reflection prevention panel RPP may function to prevent external light that is incident into the display device DD from being reflected by an internal component of the display device DD and then exiting the display device DD.

Compared to a liquid crystal display (LCD) panel, the organic light-emitting display panel may be vulnerable to the reflection of external light. In the case of the LCD panel, reflected external light is blocked by a liquid crystal layer. However, because the light-emitting display panel is a self-emissive panel and has no separate liquid crystal layer, it is structurally vulnerable to the reflection of external light. Therefore, to reduce the reflectivity of external light, the reflection prevention panel RPP is provided in the organic light-emitting display panel. However, compared to the LCD display panel, the reflection prevention panel RPP is not enough to prevent the reflection of external light. Hence, because of reduction in reflective color characteristics, it is difficult to implement real black representation.

In an exemplary embodiment, a black matrix may be further provided to prevent the reflection of external light. The black matrix may be provided in the input sensing unit or the reflection prevention panel.

As such, an exemplary embodiment may include not only the reflection prevention panel but also the black matrix, thus more reliably preventing the reflection of external light, thereby enhancing the reflective color characteristics, and facilitating the real black representation.

The reflection prevention panel RPP may include a phase retarder and a polarizer. The phase retarder may be a film type retarder or a liquid crystal coated retarder and include a $\lambda/2$ phase retarder and/or a $\lambda/4$ phase retarder. The polarizer may also be a film type polarizer or a liquid crystal coated polarizer. The film type retarder or polarizer may include an elongation synthetic resin film, and the liquid crystal coated retarder or polarizer may include liquid crystals formed in a predetermined arrangement. Each of the phase retarder and the polarizer may further include a protective film. The phase retarder and the polarizer themselves or the protective film may be defined as the base layer of the reflection prevention panel RPP.

The reflection prevention panel RPP may include color filters. The color filters have a predetermined arrangement. The arrangement of the color filters may be determined taking into account emission colors of pixels included in the display panel DP. The reflection prevention panel RPP may further include a black matrix adjacent to the color filters.

The reflection prevention panel RPP may include a destructive interference structure. For example, the destructive interference structure may include a first reflective layer and a second reflective layer which are disposed on respective different layers. First reflective light and second reflective light which are respectively reflected by the first reflective layer and the second reflective layer destructively interfere with each other, whereby the reflectivity of external light may be reduced.

The window panel WP may include a base film WP-BS and a light-shielding pattern WP-BZ. The base film WP-BS may include a glass substrate and/or a synthetic resin film. The base film WP-BS is not limited to a single layer structure. The base film WP-BS may include two or more films coupled to each other by an adhesive member.

The light-shielding pattern WP-BZ may partially overlap the base film WP-BS. The light-shielding pattern WP-BZ may be disposed on a rear surface of the base film WP-BS and define a bezel area, i.e., a non-display area DD-NDA (refer to FIG. 1), of the display device DD.

The light-shielding pattern WP-BZ may be a colored organic layer. For example, the light-shielding pattern WP-BZ may be formed by a coating method.

Although not shown, the window panel WP may further include a functional coating layer disposed on a front surface of the base film WP-BS. The functional coating layer may include a fingerprint prevention layer, a reflection prevention layer, a hard coating layer, etc.

Referring to FIG. 2, the input sensing unit may overlap the overall portion of the display panel. In a modification of the embodiment, the input sensing unit may overlap only a portion of the display area DD-DA, or overlap only the non-display area DD-NDA.

The input sensing unit may be a touch sensing panel configured to sense a touch of a user, or a fingerprint sensing panel configured to sense fingerprint information of the finger of the user. The pitches and widths of sensing electrodes, which will be explained hereinbelow, may be changed depending on the use purpose of the input sensing unit. Sensing electrodes of the touch sensing panel may have a width ranging from several millimeters (mm) to several tens of millimeters (mm). Sensing electrodes of the fingerprint sensing panel may have a width ranging from several tens of micrometers (µm) to several hundreds of micrometers (µm).

Figure 3:
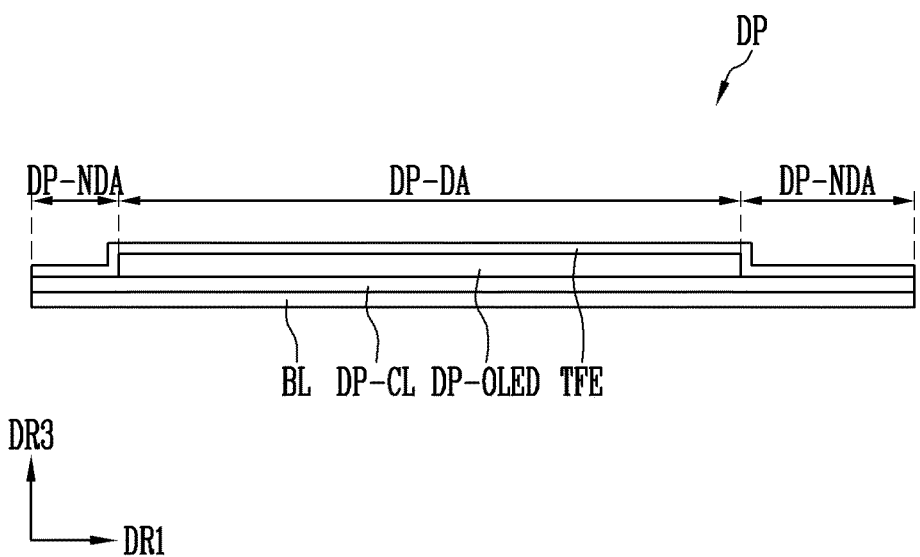
FIG. 3 is a sectional view illustrating a display panel in accordance with an exemplary embodiment of the inventive concepts.
Figure 4:
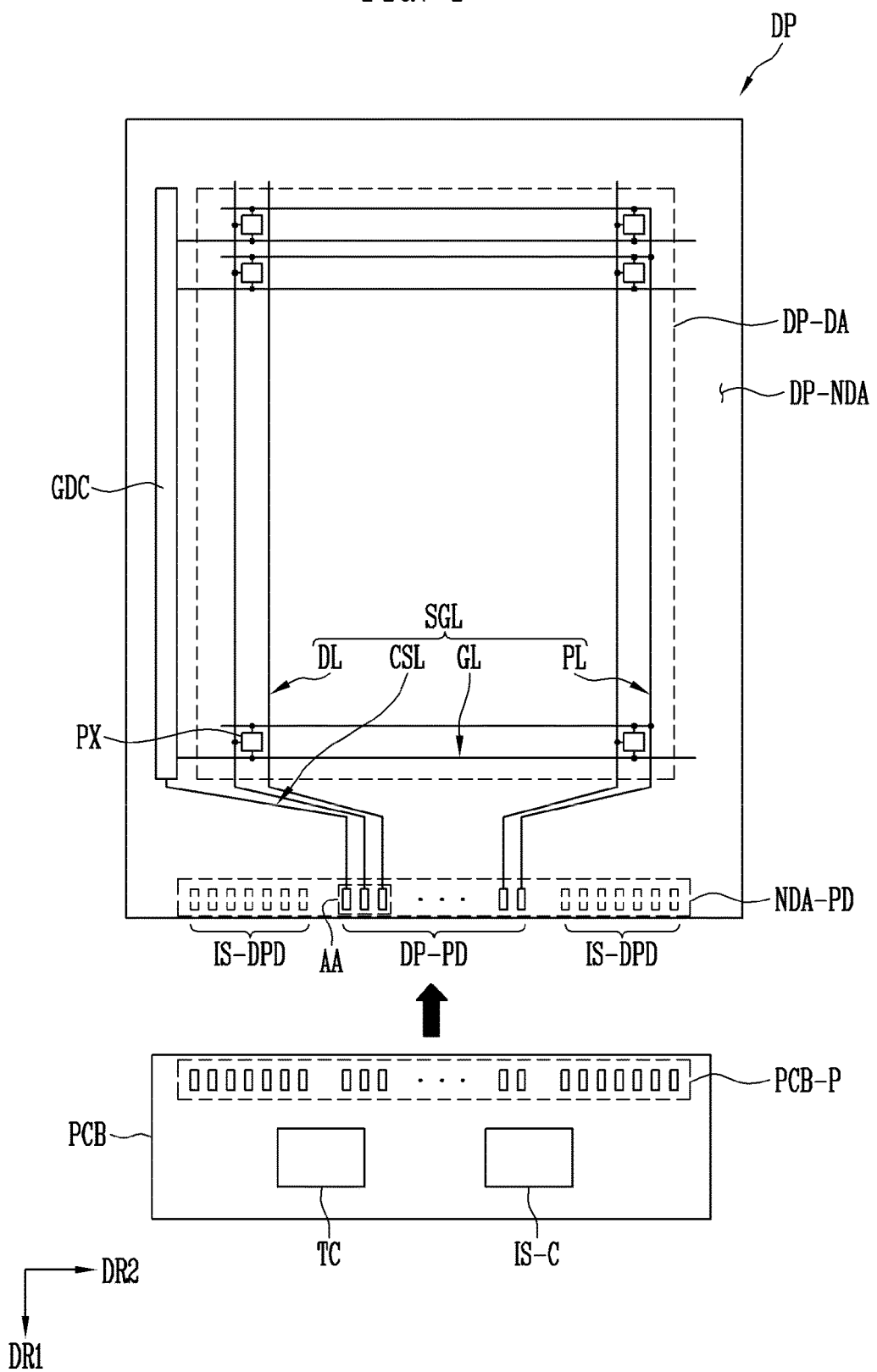
FIG. 4 is a plan view illustrating the display panel in accordance with an exemplary embodiment of the inventive concepts.
Figure 5:
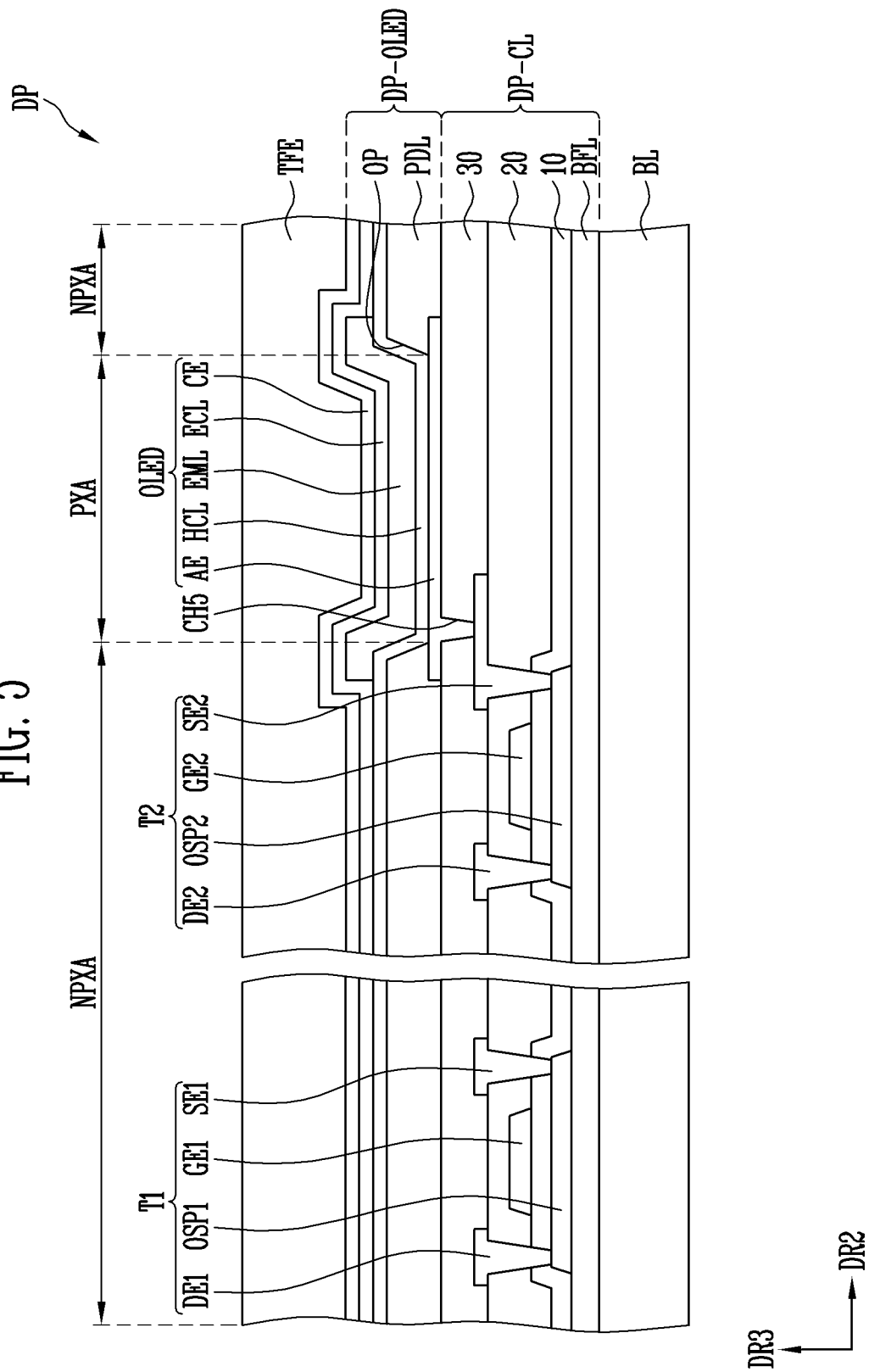
FIG. 5 is an enlarged sectional view illustrating the display panel in accordance with an exemplary embodiment of the inventive concepts.

FIG. 3 is a sectional view illustrating a display panel DP in accordance with an exemplary embodiment. FIG. 4 is a plan view illustrating the display panel DP in accordance with an exemplary embodiment. FIG. 5 is an enlarged sectional view illustrating the display panel DP in accordance with an exemplary embodiment. The display panel DP, which will be explained below, may be applied to the display device DD described with reference to FIG. 2

As shown in FIG. 3, the display panel DP may include a base layer BL, a circuit element layer DP-CL disposed on the base layer BL, a display element layer DP-OLED, and a thin-film encapsulation layer TFE. Although not shown, the display panel DP may further include functional layers, such as a reflection prevention layer and a refractivity adjustment layer.

The base layer BL may include a synthetic resin film. A synthetic resin layer may be formed on a work panel which is used when the display panel DP is manufactured. Thereafter, a conductive layer, an insulating layer, etc., may be formed on the synthetic resin layer. If the work panel is removed, the synthetic resin layer corresponds to the base layer BL. The synthetic resin layer may be a polyimide-based resin layer, and the material thereof is not limited to a particular material. The base layer BL may include a glass substrate, a metal substrate, an organic/inorganic composite material substrate, or the like.

The circuit element layer DP-CL may include at least one insulating layer and a circuit element. Hereinafter, the insulating layer included in the circuit element layer DP-CL will be referred to as an intermediate insulating layer. The intermediate insulating layer may include at least one intermediate inorganic layer and at least one intermediate organic layer 30. For example, the intermediate inorganic layer may include a buffer layer BFL, a first intermediate inorganic layer 10 and a second intermediate inorganic layer 20. The circuit element may include a signal line, a pixel driving circuit, etc. The circuit element layer DP-CL may be formed by a process of forming an insulating layer, a semiconductor layer, and a conductive layer through a coating operation, a deposition operation, etc., and a process of patterning the insulating layer, the semiconductor layer, and the conductive layer through a photolithography operation.

The display element layer DP-OLED may include a light-emitting element. The display element layer DP-OLED may include organic light-emitting diodes. The display element layer DP-OLED may further include an organic layer, such as a pixel defining layer.

The thin-film encapsulation layer TFE may encapsulate the display element layer DP-OLED. The thin-film encapsulation layer TFE may include at least one insulating layer. The thin-film encapsulation layer TFE in accordance with an exemplary embodiment may include at least one inorganic layer (hereinafter, referred to as an encapsulation inorganic layer). The thin-film encapsulation layer TFE in accordance with an exemplary embodiment may include at least one organic layer (hereinafter, referred to as an encapsulation organic layer) and at least one an encapsulation inorganic layer.

The encapsulation inorganic layer may protect the display element layer DP-OLED from water/oxygen. The encapsulation organic layer may protect the display element layer DP-OLED from foreign material such as dust particles. The encapsulation inorganic layer may include a silicon nitride layer, a silicon oxynitride layer, a silicon oxide layer, a titanium oxide layer, or an aluminum oxide layer. The inventive concepts are not limited to this, and the encapsulation inorganic layer may be formed of inorganic material capable of protecting the display element layer from water/oxygen. The encapsulation organic layer may include an acrylic organic layer, and the present disclosure is not limited thereto. The encapsulation organic layer may be formed organic material capable of protecting the display element layer from foreign material, such as dust particles.

As described above, the input sensing unit ISU may be disposed on the display panel DP, in detail, on the thin-film encapsulation layer TFE. Depending on the structure of the sensing electrode in the input sensing unit ISU, a base capacitance may be formed between the sensing electrode and an electrode of the display element layer DP-OLED in the display panel DP. Depending on the value of the base capacitance, the operating speed of the input sensing unit ISU may be determined. In other words, the sensitivity of the input sensing unit ISU may be determined. If the value of the base capacitance is increased, a charging time of a driving electrode of the sensing electrode is increased, whereby the sensitivity of the input sensing unit ISU is relatively reduced. On the other hand, if the value of the base capacitance is reduced, the charging time of the driving electrode is reduced, whereby the sensitivity of the input sensing unit ISU is relatively increased.

The thin-film encapsulation layer TFE may be ten or more times thinner than an encapsulation layer made of glass. Therefore, the distance between the sensing electrode formed on the thin-layer encapsulation layer TFE and the electrode in the display element layer DP-OLED disposed under the thin-film encapsulation layer TFE may be less than the distance between a sensing electrode formed on a glass encapsulation layer and an electrode in a display element layer DP-OLED disposed under the glass encapsulation layer. Consequently, the base capacitance of the input sensing unit ISU formed on the display panel DP having the thin-film encapsulation layer TFE may be increased, as compared to the base capacitance of the input sensing unit ISU formed on the display panel DP having the glass encapsulation layer. The charging time of the sensing electrode is delayed by the degree to which the base capacitance is increased, whereby the sensitivity of the input sensing unit ISU may deteriorate.

In the display device DD having the thin-film encapsulation layer TFE, it is very important to solve a problem of delay in charging time of the input sensing unit ISU. The charging time of the input sensing unit ISU may be proportional to the resistance and the capacitance of the input sensing unit ISU. As described above, the input sensing unit ISU formed on the thin-film encapsulation layer TFE may have a high capacitance resulting from a comparatively small thickness of the thin-film encapsulation layer TFE. Hence, the resistance of the input sensing unit ISU may be reduced, whereby the problem of delay in charging time of the input unit sensing unit ISU may be solved. A method of reducing the resistance of the input sensing unit ISU will be described later herein.

As shown in the plan view of FIG. 4, the display panel DP may include a display area DP-DA and a non-display area DP-NDA. In an exemplary embodiment, the non-display area DP-NDA may be defined along the perimeter of the display area DP-DA. The display area DP-DA and the non-display area DP-NDA of the display panel DP may respectively correspond to the display area DD-DA and the non-display area DD-NDA of the display device DD shown in FIGS. 1 and 2.

The display panel DP may include a driving circuit GDC, a plurality of signal lines SGL (hereinafter, referred to as the signal lines SGL), a plurality of signal pads DP-PD (hereinafter, referred to as the signal pads DP-PD), and a plurality of pixels PX (hereinafter, referred to as the pixels PX). The pixels PX may be disposed in the display area DA. Each of the pixels PX may include an organic light-emitting diode, and a pixel driving circuit coupled to the organic light-emitting diode. The driving circuit GDC, the signal lines SGL, the signal pads DP-PD, and the pixel driving circuit may be included in the circuit element layer DP-CL shown in FIG. 3.

The driving circuit GDC may include a scan driving circuit. The scan driving circuit may generate a plurality of scan signals, and sequentially output the scan signals to a plurality of scan lines GL, which will be explained later herein. The scan driving circuit may further output a control signal to the driving circuit.

The scan driving circuit may include a plurality of thin film transistors formed through the same process as that of the driving circuit of each pixel PX, e.g., through a low temperature polycrystalline silicon (LTPS) process or a low temperature polycrystalline oxide (LTPO) process.

The signal lines SGL may include scan lines GL, data lines DL, a power line PL, and a control signal line CSL. The scan lines GL may be coupled to corresponding ones of the pixels PX, and the data lines DL may be coupled to corresponding ones of the pixels PX. The power line PL may be coupled to the pixels PX. The control signal line CSL may provide control signals to the scan driving circuit.

The signal lines SGL may overlap the display area DP-DA and the non-display area DP-NDA. Each of the signal lines SGL may includes a pad part and a line part. The line part may overlap the display area DP-DA and the non-display area DP-NDA. The pad part may be coupled to an end of the line part. The pad part may be disposed in the non-display area DP-NDA and overlap a corresponding one of the signal pads DP-PD. A detailed description pertaining to this will be made later herein. Of the non-display area DP-NDA, an area in which the signal pads DP-PD are disposed may be defined as a pad area NDA-PD.

Substantially, the line part coupled to the corresponding pixels PX may form most of the signal line SGL. The line part may be coupled to transistors T1 and T2 of each of the corresponding pixels PX. The line part may be formed of a single layer or a multilayer structure. The line part may be formed of a single body or two or more bodies. The two or more bodies may be disposed on different layers and coupled to each other through a contact hole that passes through an insulating layer disposed between the two or more bodies.

The display panel DP may further include dummy pads IS-DPD disposed on the pad area NDA-PD. The dummy pads IS-DPD may be formed through the same process as that of the signal lines SGL and, thus, disposed on the same layer as that of the signal lines SGL. The dummy pads IS-DPD may be selectively provided in the display device DD including the input sensing layer ISL, as shown in FIG. 2, and may be omitted in the display device DD having the input sensing unit ISU.

The dummy pads IS-DPD may overlap the pad parts of the signal lines that are provided on the input sensing layer ISL shown in FIG. 2. The dummy pads IS-DPD may be floating electrodes. The dummy pads IS-DPD may be electrically insulated from the signal lines SGL of the display panel. A detailed description pertaining to this will be made later herein.

In FIG. 4, an additional printed circuit board PCB is shown that is electrically coupled to the display panel DP. The printed circuit board PCB may be a rigid circuit board or a flexible circuit board. The printed circuit board PCB may be directly coupled to the display panel DP, or may be coupled to the display panel DP by another printed circuit board.

A timing control circuit TC configured to control the operation of the display panel DP may be disposed on the circuit board PCB. Furthermore, an input sensing circuit IS-C configured to control the input sensing unit ISU or the input sensing layer ISL may be disposed on the printed circuit board PCB. Each of the timing control circuit TC and the input sensing circuit IS-C may be mounted on the printed circuit board PCB in the form of an integrated chip. In an exemplary embodiment, the timing control circuit TC and the input sensing circuit IS-C may be mounted on the printed circuit board PCB in the form of a single integrated chip. The printed circuit board PCB may include circuit board pads PCB-P which are electrically coupled to the display panel DP. Although not shown, the printed circuit board PCB may further include signal lines that couple the circuit board pads PCB-P with the timing control circuit TC and/or the input sensing circuit IS-C.

As shown in FIG. 5, a first semiconductor OSP1 and a second semiconductor OSP2 may be provided on the buffer layer BFL, and the first intermediate inorganic layer 10 may be provided on the first semiconductor OSP1 and the second semiconductor OSP2. A first gate electrode GE1 and a second gate electrode GE2 may be provided on the first intermediate inorganic layer 10, and the second intermediate inorganic layer 20 may be provided on the first gate electrode GE1 and the second gate electrode GE2.

The intermediate organic layer 30 provided for covering a first input electrode DE1, a second input electrode DE2, a first output electrode SE1, and a second output electrode SE2 may be disposed on the second intermediate inorganic layer 20. The intermediate organic layer 30 may provide a planar surface.

The display element layer DP-OLED may be disposed on the intermediate organic layer 30. The display element layer DP-OLED may include a pixel defining layer PDL and an organic light-emitting diode OLED. The pixel defining layer PDL may include organic material. A first electrode AE may be disposed on the intermediate organic layer 30. The first electrode AE may be coupled to the second output electrode SE2 through a fifth through hole CH5 that passes through the intermediate organic layer 30. An opening OP may be formed in the pixel defining layer PDL. The opening OP of the pixel defining layer PDL may expose at least a portion of the first electrode AE. In a modification of this exemplary embodiment, the pixel defining layer PDL may be omitted.

The pixels PX may be disposed in the display area DP-DA. The display area DP-DA may include an emission area PXA and a non-emission area NPXA disposed adjacent to the emission area PXA. The non-emission area NPXA may enclose the emission area PXA. The emission area PXA may be defined to correspond to the portion of the first electrode AE that is exposed through the opening OP. The non-emission area NPXA may be defined to correspond to the pixel defining layer PDL.

The emission area PXA may overlap at least one of the first and second transistors T1 and T2. The opening OP may be increased in width. The first electrode AE and an emission layer EML, which will be described later herein, may also be increased in width.

A hole control layer HCL may be disposed in common in the emission area PXA and the non-emission area NPXA. Although not shown, a common layer, such as the hole control layer HCL, may be formed in common in the pixels PX (refer to FIG. 4).

The emission layer EML may be disposed on the hole control layer HCL. The emission layer EML may be disposed in an area corresponding to the opening OP. In other words, the emission layer EML may be separately formed in each of the pixels PX. The emission layer EML may include organic material and/or inorganic material. The emission layer EML may generate predetermined color of light.

Although the patterned emission layer EML has been illustrated in this exemplary embodiment, the emission layer EML may be provided in common for the pixels PX. Here, the emission layer EML may generate white light. In addition, the emission layer EML may have a multilayer structure, called a tandem structure.

An electron control layer ECL may be disposed on the emission layer EML. Although not shown, an electron control layer ECL may be formed in common in the pixels PX (refer to FIG. 4). A second electrode CE may be disposed on the electron control layer ECL. The second electrode CE may be disposed in common in the pixels PX.

A thin-film encapsulation layer TFE may be disposed on the second electrode CE. The thin-film encapsulation layer TFE may be disposed in common in the pixels PX. In an exemplary embodiment, the thin-film encapsulation layer TFE may directly cover the second electrode CE. A capping layer (not shown) suitable for covering the second electrode CE may be further disposed between the thin-film encapsulation layer TFE and the second electrode CE. The thin-film encapsulation layer TFE may directly cover the capping layer.

In an exemplary embodiment, the organic light-emitting diode OLED may further include a resonance structure suitable (not shown) for controlling the resonance distance of light generated from the emission layer EML. The resonance structure may be disposed between the first electrode AE and the second electrode CE. The thickness of the resonance structure may be determined depending on the wavelength of light generated from the emission layer EML.

FIGS. 6A to 6D are sectional views illustrating exemplary embodiments of the thin-film encapsulation layer TFE in accordance with the inventive concepts. The explanation of the thin-film encapsulation layer TFE described with reference to FIG. 3 may also be applied to the following description.

Figure 6A:
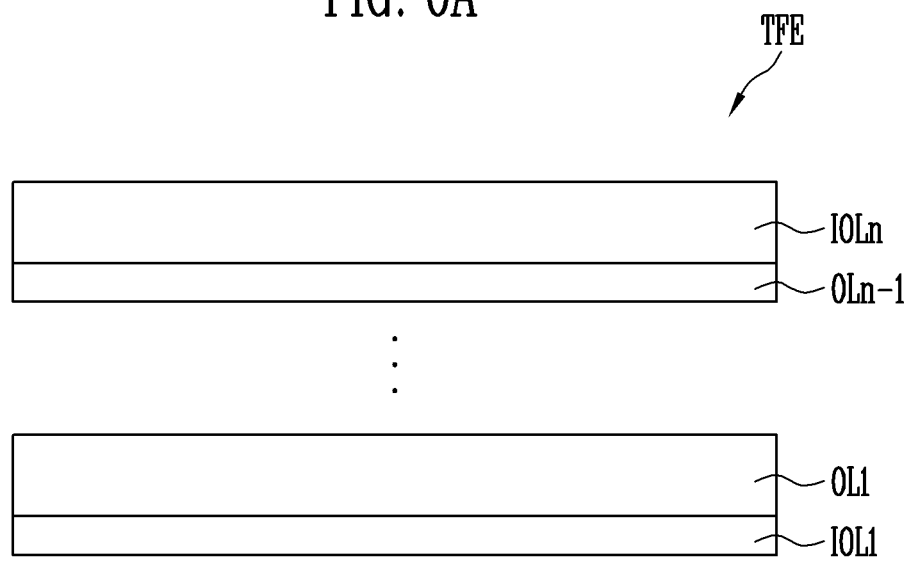
FIG. 6A, FIG. 6B, FIG. 6C, and FIG. 6D are sectional views illustrating exemplary embodiments of a thin-film encapsulation layer in accordance with the inventive concepts.

As shown in FIG. 6A, the thin-film encapsulation layer TFE in accordance with an exemplary embodiment may include n (here, n is a natural number of 2 or more) encapsulation inorganic layers IOL1 to IOLn including a first encapsulation inorganic layer IOL1 that comes into contact with the second electrode CE (refer to FIG. 5).

In addition, the thin-film encapsulation layer TFE may include n−1 encapsulation organic layers OL1. The n−1 encapsulation organic layers OL1 may alternate with the n encapsulation inorganic layers IOL1 to IOLn. The average thickness of each of the n−1 encapsulation organic layers OL1 may be greater than that of each of the n encapsulation inorganic layers IOL1 to IOLn.

Each of the n encapsulation inorganic layers IOL1 to IOLn may have a single-layer structure formed of one kind of material, or a multilayer structure including multiple layers formed of different kinds of materials. The n−1 encapsulation organic layers OL1 may be formed by depositing organic monomers. For example, the organic monomers may include acrylic monomer, but are not so limited.

In an exemplary embodiment, the thin-film encapsulation layer TFE may include a silicon oxy nitride layer, an organic monomer layer, and a silicon nitride layer that are sequentially stacked on the second electrode CE. Another inorganic layer may be disposed on the silicon nitride layer. The silicon nitride layer may have multiple layers (e.g., two layers) deposited under different conditions.

Figure 6B:
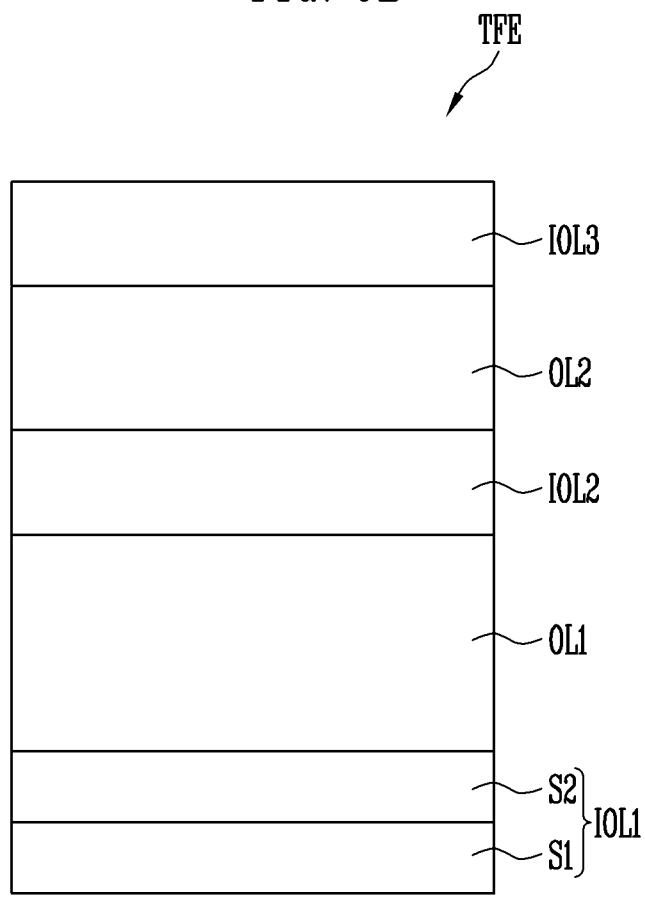

As shown in FIG. 6B, the thin-film encapsulation layer TFE may include a first encapsulation inorganic layer IOL1, a first encapsulation organic layer OL1, a second encapsulation inorganic layer IOL2, a second encapsulation organic layer OL2, and a third encapsulation inorganic layer IOL3 that are sequentially stacked.

The first encapsulation inorganic layer IOL1 may have a two-layer structure. A first sub-layer S1 may be a lithium fluoride layer. A second sub-layer S2 may be an aluminum oxide layer. The first encapsulation organic layer OL1 may be a first organic monomer layer. The second encapsulation inorganic layer IOL2 may be a first silicon nitride layer. The second encapsulation organic layer OL2 may be a second organic monomer layer. The third encapsulation inorganic layer IOL3 may be a second silicon nitride layer.

Figure 6C:
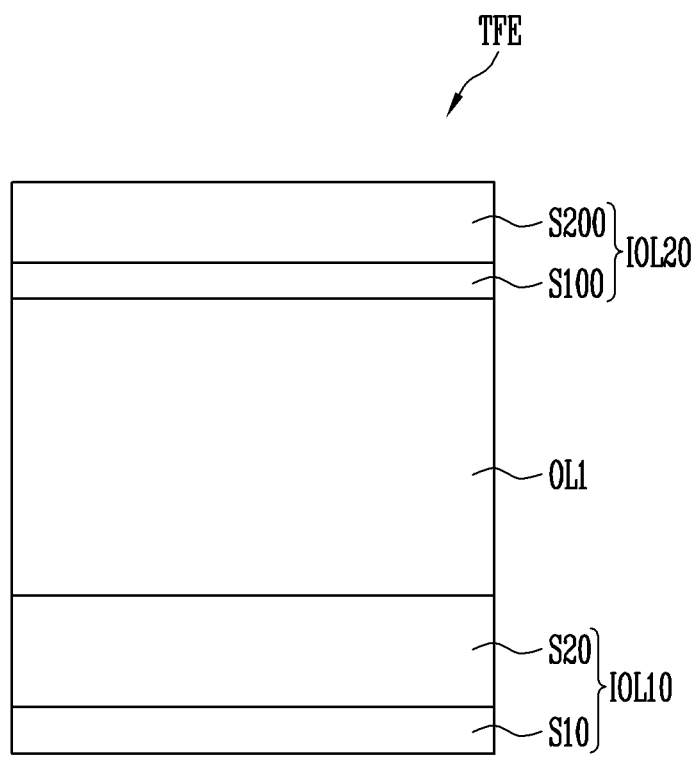

As shown in FIG. 6C, the thin-film encapsulation layer TFE may include a first encapsulation inorganic layer IOL10, a first encapsulation organic layer OL1, and a second encapsulation inorganic layer IOL20 that are sequentially stacked. Each of the first and second encapsulation inorganic layers IOL10 and IOL20 may have a two-layer structure. A first sub-layer S10 may be a lithium fluoride layer. A second sub-layer S20 may be a silicon oxide layer. The second encapsulation inorganic layer IOL20 may include a first sub-layer S100 and a second sub-layer S200 that are deposited under different deposition conditions. The first sub-layer S100 may be deposited under low power conditions. The second sub-layer S200 may be deposited under high power conditions. Each of the first and second sub-layers S100 and S200 may be a silicon nitride layer.

Figure 6D:
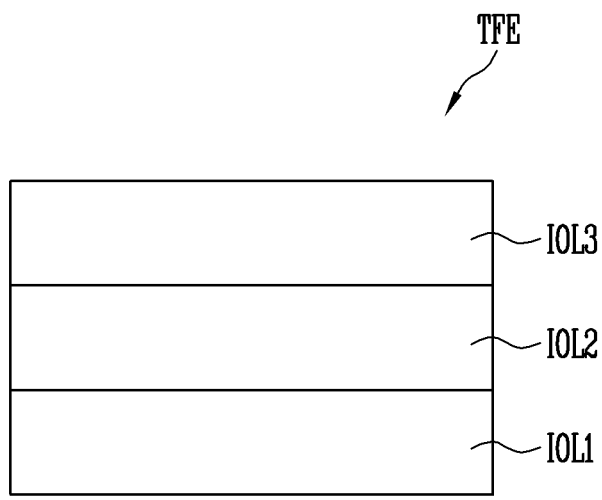

As shown in FIG. 6D, the thin-film encapsulation layer TFE may include a plurality of encapsulation inorganic layers that are sequentially stacked. The thin-film encapsulation layer TFE may include a first encapsulation inorganic layer IOL1, a second encapsulation inorganic layer IOL2, and a third encapsulation inorganic layer IOL3. At least one or more of the encapsulation inorganic layers may include, e.g., a silicon nitride layer, a silicon oxy nitride layer, a silicon oxide layer, a titanium oxide layer, or an aluminum oxide layer. For example, the first encapsulation inorganic layer IOL1 and the third encapsulation inorganic layer IOL3 may include a silicon nitride layer, a silicon oxy nitride layer, a silicon oxide layer, a titanium oxide layer, or an aluminum oxide layer.

At least one or more of the encapsulation inorganic layers IOL1, IOL2, IOL3 may be a hexamethyldisiloxane (HMDSO) layer. The HMDSO layer may absorb stress. The second encapsulation inorganic layer IOL2 may be an HMDSO layer. The second encapsulation inorganic layer IOL2 may absorb stress of the first and third encapsulation inorganic layers IOL1 and IOL3. Thereby, the flexibility of the thin-film encapsulation layer TFE may be increased.

If the thin-film encapsulation layer TFE includes only encapsulation inorganic layers, a process of forming the thin-film encapsulation layer TFE may be simplified because it may be formed in one chamber through a continuous deposition process. If the thin-film encapsulation layer TFE include an encapsulation organic layer and an encapsulation inorganic layer, an operation of transferring it between chambers at least one time may be required. If one of the encapsulation inorganic layers is an HMDSO layer, the thin-film encapsulation layer TFE may have flexibility.

Figure 7:
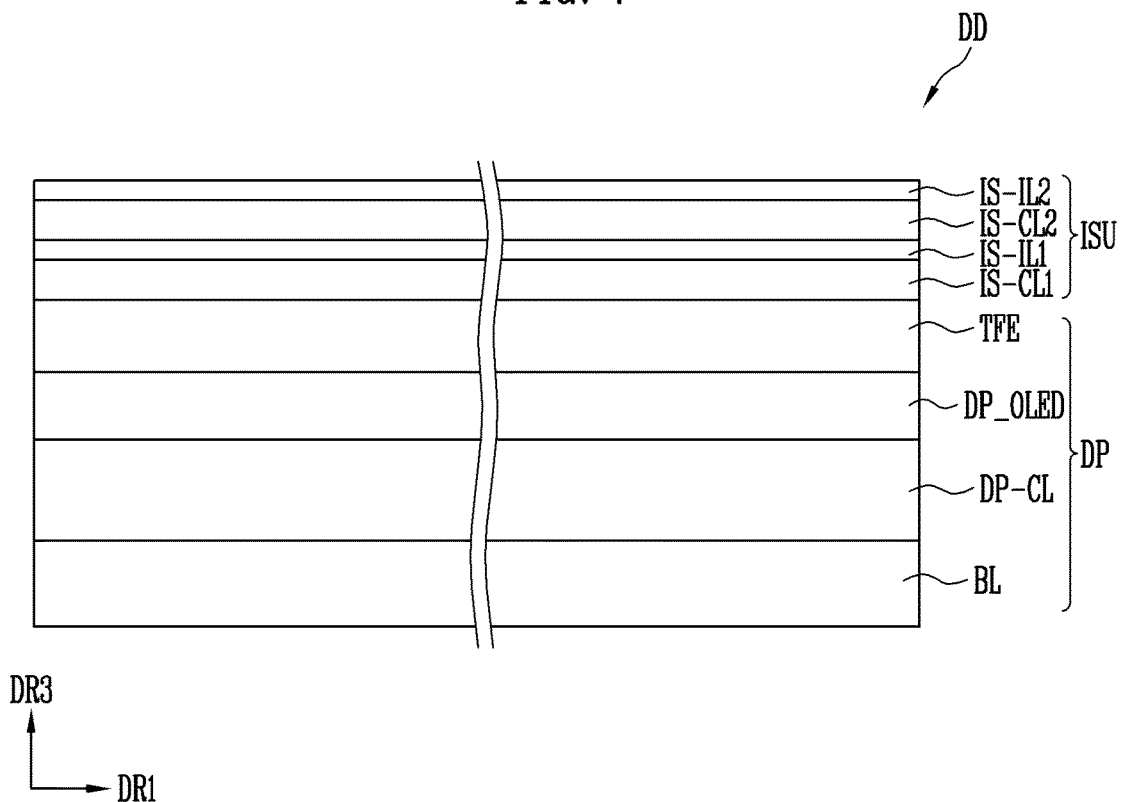
FIG. 7 is a sectional view illustrating a display device in accordance with an exemplary embodiment of the inventive concepts.

FIG. 7 is a sectional view illustrating a display device DD in accordance with an exemplary embodiment of the inventive concepts. FIG. 7 is a schematic view of the display panel DP to illustrate a stacking structure of the input sensing unit ISU. A reflection prevention unit and a window unit which may be disposed on the input sensing unit ISU are not shown in FIG. 7.

In an exemplary embodiment, an input sensing unit ISU having a "layer" structure described with reference to FIG. 2 will be explained for illustrative purposes. The input sensing unit ISU having the "layer" structure may be directly disposed on the base surface provided by the display panel DP, so that a separate base layer may be omitted, unlike the fingerprint sensor ISU having a "panel" structure. Thereby, the thickness of the display module DM may be reduced. In an exemplary embodiment, the base surface may be an upper surface of the thin film encapsulation layer TFE.

The input sensing unit ISU may have a multilayer structure, regardless of whether it has a "panel" structure or a "layer" structure. The input sensing unit ISU may include a sensing electrode, a signal line coupled to the sensing electrode, and at least one insulating layer. For instance, the input sensing unit ISU may sense an external input by a capacitive sensing method. The operating method of the input sensing unit ISU according to the inventive concepts is not limited to a particular method. In an exemplary embodiment, the input sensing unit ISU may sense an external input by an electromagnetic induction method or a pressure sensing method.

Referring to FIG. 7, the input sensing unit ISU may include a first conductive layer IS-CL1, a first insulating layer IS-IL1, a second conductive layer IS-CL2, and a second insulating layer IS-IL2. Each of the first and second conductive layers IS-CL1 and IS-CL2 may have a single-layer structure, or a multilayer structure in which multiple layers are stacked along the third directional axis DR3.

The conductive layer having a single-layer structure may include a metal layer or a transparent conductive layer. The metal layer may include molybdenum, silver, titanium, copper, aluminum, and an alloy of them. The transparent conductive layer may include transparent conductive oxide such as indium tin oxide (ITO), indium zinc oxide (IZO), zinc oxide (ZnO), or indium tin zinc oxide (ITZO). In addition, the transparent conductive layer may include a conducting polymer, such as PEDOT, a metal nanowire, graphene, etc.

The conductive layer having a multilayer structure may include multiple metal layers. The multiple metal layers may form a three-layer structure having a titanium/aluminum/titanium layer structure. The conductive layer having a multilayer structure may include at least one metal layer and at least one transparent conductive layer.

Each of the first and second conductive layers IS-CL1 and IS-CL2 may include a plurality of patterns. Hereinafter, description will be made for the case where the first conductive layer IS-CL1 includes first conductive patterns and the second conductive layer IS-CL2 include second conductive patterns. Each of the first and second conductive patterns may include sensing electrodes and signal lines.

The stacking structure and the material of the sensing electrodes may be determined taking a sensing sensitivity into account. An RC delay may affect the sensing sensitivity. Given this, because the resistance of the metal layer is less than that of the transparent conductive layer, the time constant, i.e., the RC value, of the sensing electrodes each of which includes a metal layer is reduced, compared to that of the sensing electrodes each of which includes a transparent conductive layer. In the input sensing unit, the RC value means a charging time of a capacitor defined between the sensing electrodes. In the case of the sensing electrodes each of which includes a metal layer, the sensing sensitivity may be enhanced because the charging time of the capacitor may be less than that of the sensing electrodes each of which includes a transparent conductive layer. On the other hand, the sensing electrodes each of which includes a transparent conductive layer may be invisible to a user and have a comparatively high capacitance because they have an increased input surface area. As will be described below, the sensing electrodes each of which includes a metal layer may have a mesh structure to prevent them from being visible to the user.

The thickness of the thin-film encapsulation layer TFE may be adjusted to prevent the input sensing unit ISU from being affected by noise generated by components of the display element layer DP-OLED. Each of the first and second insulating layers IS-IL1 and IS-IL2 may have a single-layer or multilayer structure. Each of the first and second insulating layers IS-IL1 and IS-IL2 may include inorganic material, organic material, or composite material.

At least one of the first and second insulating layers IS-IL1 and IS-IL2 may include an inorganic layer. The inorganic layer may include at least one of aluminum oxide, titanium oxide, silicon oxide, silicon oxynitride, zirconium oxide, and hafnium oxide.

At least one of the first and second insulating layers IS-IL1 and IS-IL2 may include an organic layer. The organic layer may include acrylic resin, methacrylic resin, polyisoprene, vinyl-based resin, epoxy-based resin, urethane-based resin, cellulose-based resin, siloxane-based resin, polyimide-based resin, polyamide-based resin, and perylene-based resin.

Although not shown in FIG. 7, the input sensing unit ISU may include a light absorption pattern. The light absorption pattern may have an opening through which an emission area is exposed, and may be disposed to overlap a non-emission area. The light absorption pattern may prevent reflection of external light that is incident into the display device DD.

The input sensing unit ISU may have a base corresponding to the display panel DP. In other words, the base may be a surface that faces the display panel DP. The display area and the non-display area of the display panel DP may respectively correspond to a sensing area and a non-sensing area of the base of the input sensing unit ISU. The emission area and the non-emission area of the display panel DP may respectively correspond to a light transmitting area and a light non-transmitting area of the base of the input sensing unit ISU. The emission area and the non-emission area may be respectively used identically with the light transmitting area and the light non-transmitting area.

A light path changing unit (not shown) may be provided between the first insulating layer IS-IL1 and the second insulating layer IS-IL2. The light path changing unit may be formed on an interface between the first insulating layer IS-IL1 and the second insulating layer IS-IL2 and protrude toward the display element layer DP-OLED or out of the display device DD in a direction opposite to the display element layer DP-OLED. For example, the light path changing unit may have the form of a concave or convex lens facing the display element layer DP-OLED. The light path changing unit may change the path of light toward the light path changing unit to condense or diffuse the light, thus increasing the luminance of the front surface of the display device DD, or improving the white angular dependency (WAD) thereof.

Figure 8:
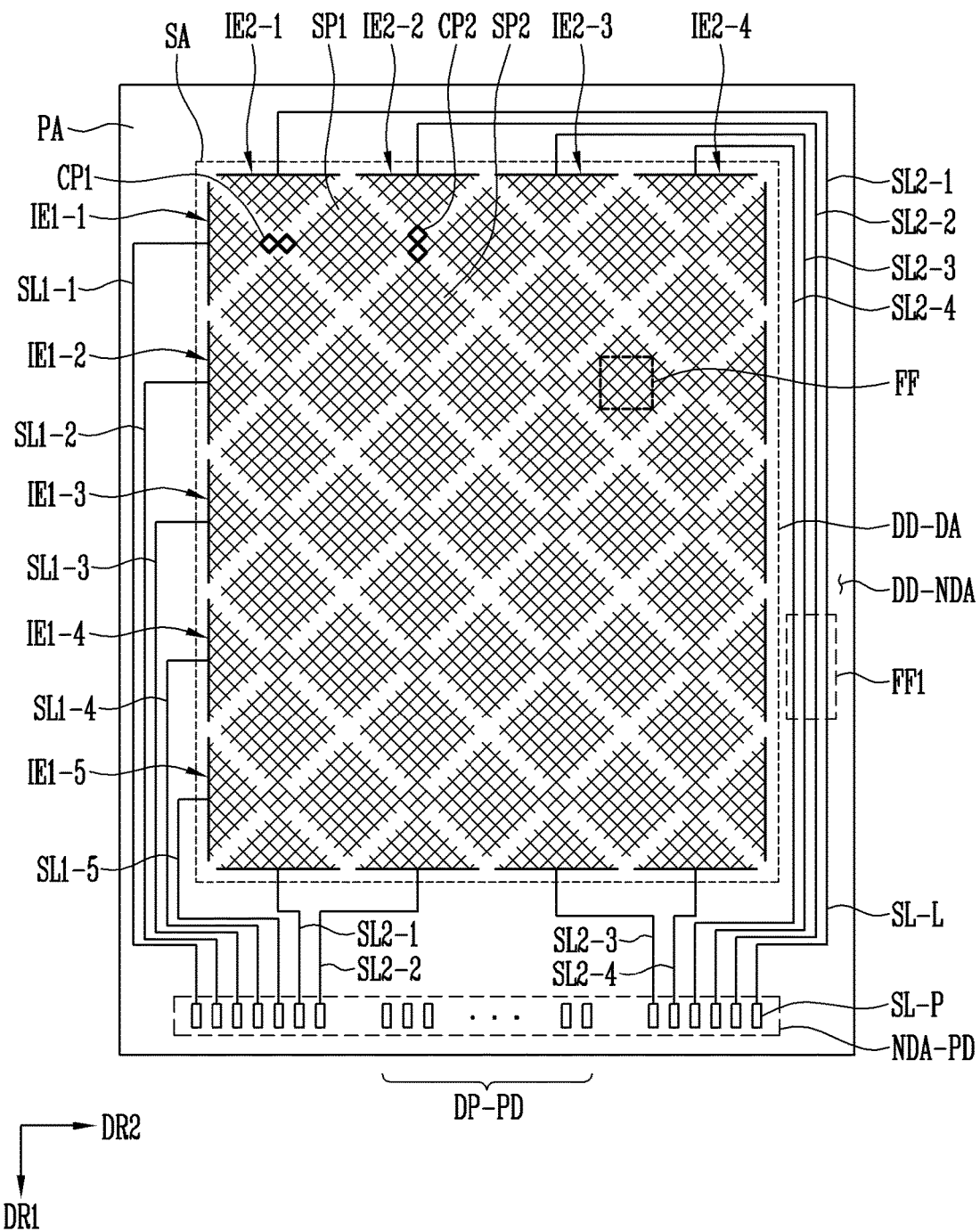
FIG. 8 is a plan view illustrating an input sensing unit in accordance with an exemplary embodiment of the inventive concepts.
Figure 9:
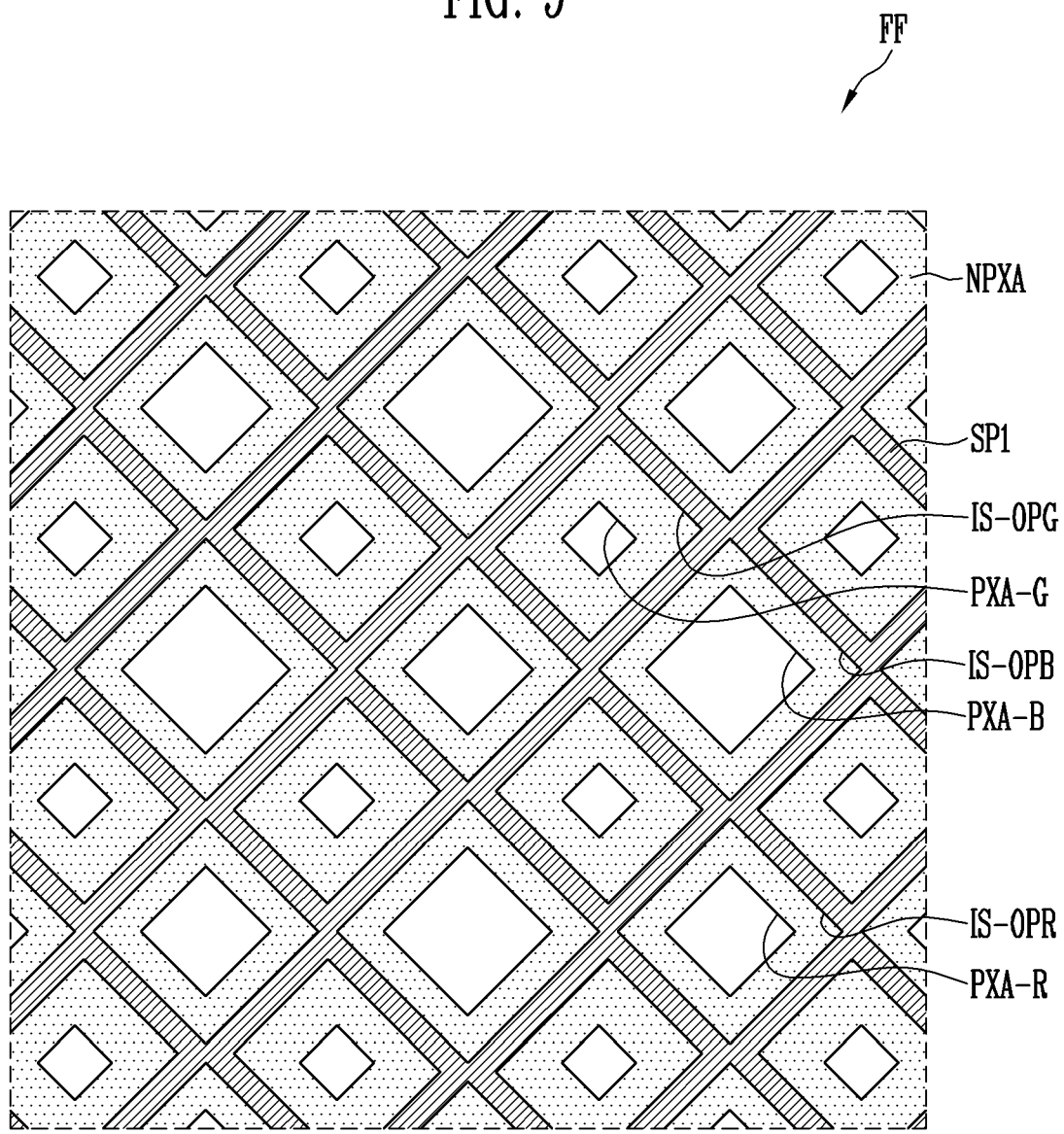
FIG. 9 is a plan view illustrating an enlargement of region FF of the input sensing unit shown in FIG. 8.
Figure 10:
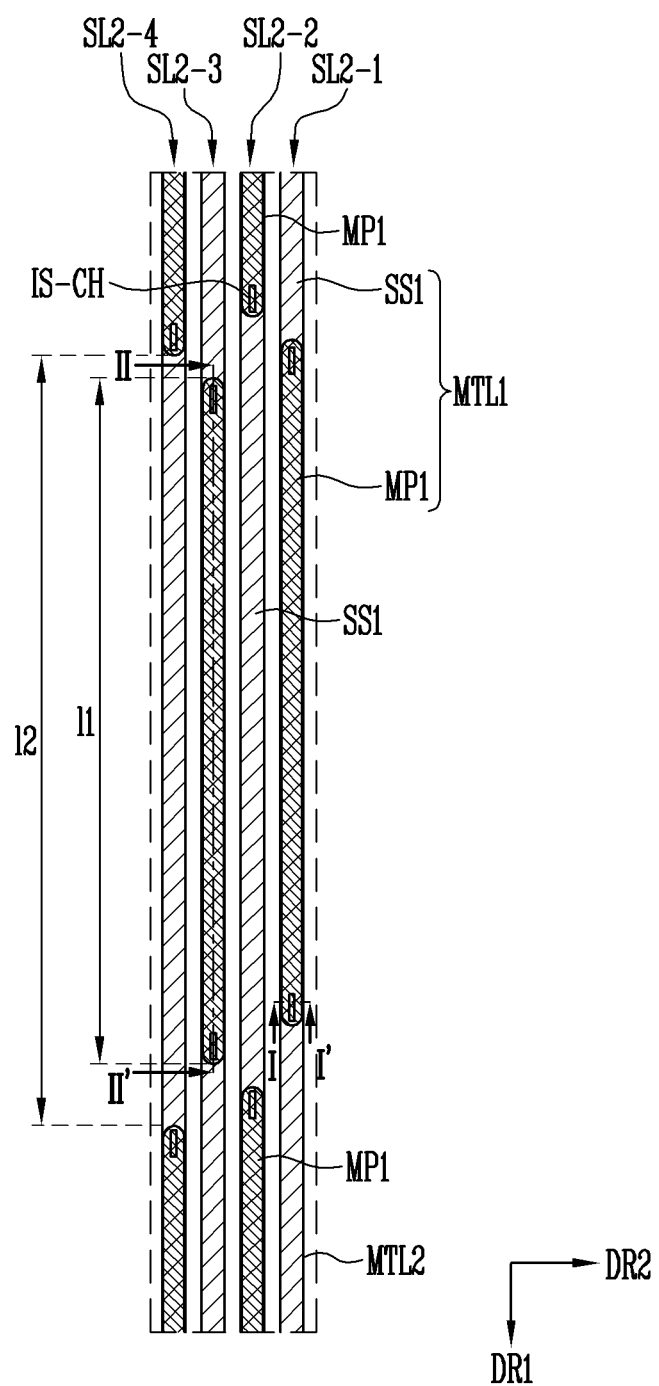
FIG. 10 is a plan view illustrating an enlargement of region FF1 of the input sensing unit shown in FIG. 8.

FIG. 8 is a plan view illustrating the input sensing unit ISU in accordance with an exemplary embodiment of the inventive concepts, FIG. 9 is a plan view illustrating an enlargement of region FF of the input sensing unit ISU shown in FIG. 8, and FIG. 10 is a plan view illustrating an enlargement of region FF1 of the input sensing unit ISU shown in FIG. 8. Hereinafter, detailed description of the same configuration as that of the display device DD described with reference to FIGS. 1 to 7 will be omitted. The circuit element layer DP-CL is schematically illustrated.

Referring to FIG. 8, the input sensing unit ISU may include a sensing area SA configured to sense an input, e.g., a touch and/or a pressure of the touch, of the user, and a peripheral area PA provided on at least one side of the sensing area SA.

The sensing area SA may correspond to the display area DA of the display panel DP and have a surface area substantially equal to or greater than that of the display area DA. The peripheral area PA may be disposed adjacent to the sensing area SA. The peripheral area PA may correspond to the non-display area NDA of the display panel 100, and include a horizontal part and a vertical part.

The input sensing unit ISU may include first sensing electrodes IE1-1 to IE1-5 and second sensing electrodes IE2-1 to IE2-4 which are provided in the sensing area SA, and first signal lines SL1-1 to SL1-5 and second signal lines SL2-1 to SL2-4 which are provided in the peripheral area PA.

In each first sensing electrode, first sensors SP1 may be arranged in the second directional axis DR2. In each second sensing electrode, second sensors SP2 may be arranged in the first directional axis DR1. Each of first connectors CP1 may couple the corresponding adjacent first sensors SP1 to each other. Each of second connectors CP2 may couple the corresponding adjacent second sensors SP2 to each other.

Each of the first sensing electrodes IE1-1 to IE1-5 and the second sensing electrodes IE2-1 to IE2-4 may have a mesh pattern. The mesh pattern may include a mesh line that is a metal line forming at least one mesh hole IS-OPR, IS-OPG, IS-OPB.

Since each of the first sensing electrodes IE1-1 to IE1-5 and the second sensing electrodes IE2-1 to IE2-4 has a mesh pattern, a parasitic capacitance between it and the electrodes of the display panel DP (refer to FIG. 7) may be reduced.

Furthermore, as will be described below, the first sensing electrodes IE1-1 to IE1-5 and the second sensing electrodes IE2-1 to IE2-4 may not overlap emission areas PXA-R, PXA-G, and PXA-B, so that they are invisible to the user.

Having a mesh pattern, each of the first sensing electrodes IE1-1 to IE1-5 and the second sensing electrodes IE2-1 to IE2-4 may include silver, aluminum, copper, chrome, nickel, titanium, and so forth, although the inventive concepts are not so limited.

In the case where the first sensing electrodes IE1-1 to IE1-5 and the second sensing electrodes IE2-1 to IE2-4 are formed of metal capable of using a low temperature process, the organic light-emitting diodes OLED (refer to FIG. 5) may be prevented from being damaged even when the input sensing unit ISU is formed through a continuous process after a process of manufacturing the display panel DP. In detail, when a flexible display device is manufactured, the thin-film encapsulation layer TFE in lieu of the glass encapsulation layer may be used as the capping layer. The thin-film encapsulation layer TFE is thinner than the glass encapsulation layer. Hence, if the sensing electrodes of the input sensing unit are formed on the thin-film encapsulation layer TFE through a continuous process, the display element layer DP-OLED of the display panel DP may be damaged by heat generated when the sensing electrodes are formed. In the case where the sensing electrodes are formed of metal capable of using the low temperature process, damage to the display element layer DP-OLED may be minimized even when the input sensing unit is formed through a continuous process after an encapsulation process.

In the case where the first sensing electrodes IE1-1 to IE1-5 and the second sensing electrodes IE2-1 to IE2-4 are directly formed in a mesh pattern on the display panel DP, the flexibility of the display device DD may be enhanced.

Although the first sensors SP1 and the second sensors SP2 included in the first sensing electrodes IE1-1 to IE1-5 and the second sensing electrodes IE2-1 to IE2-4 shown in FIG. 8 each have a rhombus shape, the present disclosure is not limited thereto. The first and second sensors SP1 and SP2 may have other polygonal shapes. Each of the first sensing electrodes IE1-1 to IE1-5 and the second sensing electrodes IE2-1 to IE2-4 may have a shape (e.g., a bar shape) in which the sensors and the connectors are not distinct from each other.

The first signal lines SL1-1 to SL1-5 may be coupled to one-side ends of the respective first sensing electrodes IE1-1 to IE1-5. The second signal lines SL2-1 to SL2-4 may be coupled to both ends of the respective second sensing electrodes IE2-1 to IE2-4. In an exemplary embodiment, the first signal lines SL1-1 to SL1-5 may also be coupled to both ends of the respective first sensing electrodes IE1-1 to IE1-5. In an exemplary embodiment, the second signal lines SL2-1 to SL2-4 may be coupled to only one-side ends of the respective second sensing electrodes IE2-1 to IE2-4.

The sensing sensitivity of the input sensing unit ISU including the second signal lines SL2-1 to SL2-4 coupled to both ends of the respective second sensing electrodes IE2-1 to IE2-4, as shown in FIG. 8, may be enhanced, compared to that of an input sensing unit ISU including the second signal lines SL2-1 to SL2-4 coupled to only one-side ends of the respective second sensing electrodes IE2-1 to IE2-4. Because the second sensing electrodes IE2-1 to IE2-4 are longer than the first sensing electrodes IE1-1 to IE1-5, the degree of voltage drop of a detection signal (or a transmitting signal) on the second sensing electrodes IE2-1 to IE2-4 may be increased, whereby the sensing sensitivity may be reduced. In an exemplary embodiment, since the detection signal (or the transmitting signal) is provided through the second signal lines SL2-1 to SL2-4 coupled to both ends of the respective second sensing electrodes IE2-1 to IE2-4, the voltage drop of the detection signal (or the transmitting signal) may be prevented, whereby the sensing sensitivity may be prevented from being reduced.

As shown in FIG. 8, the first signal lines SL1-1 to SL1-5 may be disposed on the left side, and the second signal lines SL2-1 to SL2-4 may be disposed on the right side. However, the positions of the first signal lines SL1-1 to SL1-5 and the second signal lines SL2-1 to SL2-4 may be reversed. For example, unlike what is illustrated in FIG. 8, the first signal lines SL1-1 to SL1-5 may be disposed on the right side, and the second signal lines SL2-1 to SL2-4 may be disposed on the left side.

Each of the first and second signal lines SL1-1 to SL1-5 and SL2-1 to SL2-4 may include a line part SL-L and a pad part SL-P. The pad parts SL-P may be arranged in the pad area NDA-PD. The pad parts SL-P may overlap the dummy pads IS-DPD shown in FIG. 4. The line part SL-L may include a first line MTL1 and a second line MTL2 that overlap each other at upper and lower positions, which will be described later herein.

The input sensing unit ISU may include signal pads DP-PD. The signal pads DP-PD may be arranged in the pad area NDA-PD.

In an exemplary embodiment, the first signal lines SL1-1 to SL1-5 and the second signal lines SL2-1 to SL2-4 may be replaced with a printed circuit board, which may be separately manufactured and coupled to other components.

FIG. 9 is a view illustrating an enlargement of region FF of the input sensing unit shown in FIG. 8. Referring to FIG. 9, the first sensor SP1 may overlap the non-emission area NPXA but not overlap the emission areas PXA-R, PXA-G, and PXA-B. Each of the emission areas PXA-R, PXA-G, and PXA-B may be defined in the same manner as that of the emission area PXA shown in FIG. 5.

Mesh lines (metal lines) of the first sensor SP1 may define a plurality of mesh holes IS-OPR, IS-OPG, and IS-OPB (hereinafter, referred to as "mesh holes"). The mesh holes IS-OPR, IS-OPG, and IS-OPB may correspond to the openings ABS-OPG of the emission areas PXA-R, PXA-G, and PXA-B on a one-to-one basis. In other words, the emission areas PXA-R, PXA-G, and PXA-B may be exposed through the mesh holes IS-OPR, IS-OPG, and IS-OPB.

A width w1 of each mesh line may be less than a width w3 of the pixel defining layer PDL corresponding to the non-emission area NPXA.

As such, the mesh lines may be formed on the non-emission area NPXA and not enter the emission areas PXA-R, PXA-G, and PXA-B. Therefore, light emitted from the emission areas PXA-R, PXA-G, and PXA-B may be minimized from being blocked by the mesh lines, and the mesh lines may be prevented from being visible to the user.

Each of the mesh lines may form a three-layer structure having a titanium/aluminum/titanium layer structure.

The emission areas PXA-R, PXA-G, and PXA-B may be classified into a plurality of groups according to the colors of light generated from the organic light-emitting diodes OLED. FIG. 9 illustrates an example in which the emission areas PXA-R, PXA-G, and PXA-B are classified into three groups.

The emission areas PXA-R, PXA-G, and PXA-B may have different surface areas depending on the colors of light generated from the organic light-emitting diodes OLED. The surface area of each emission area PXA-R, PXA-G, PXA-B may be determined according to the kind of corresponding organic light-emitting diode OLED.

The mesh holes IS-OPR, IS-OPG, IS-OPB may be classified into a plurality of groups having different surface areas. The mesh holes IS-OPR, IS-OPG, and IS-OPB may be classified into three groups corresponding to the emission areas PXA-R, PXA-G, and PXA-B.

Although the mesh holes IS-OPR, IS-OPG, and IS-OPB correspond to the emission areas PXA-R, PXA-G, and PXA-B on a one-to-one basis, the inventive concepts are not limited thereto. Each of the mesh holes IS-OPR, IS-OPG, and IS-OPB may correspond to two or more emission areas PXA-R, PXA-G, or PXA-B. In this case, the mesh lines forming the mesh holes IS-OPR, IS-OPG, and IS-OPB may also correspond to the light absorption pattern (ABS) formed on the non-emission area NPXA.

Although there has been shown an example where the emission areas PXA-R, PXA-G, and PXA-B have various surface areas, the inventive concepts are not limited thereto. In other words, the emission areas PXA-R, PXA-G, and PXA-B may have the same size, and the mesh holes IS-OPR, IS-OPG, and IS-OPB may also have the same size. The plan shape of each of the mesh holes IS-OPR, IS-OPG, and IS-OPB may not be limited, and it may have a rhombus shape or other polygonal shapes. The plan shape of each of the mesh holes IS-OPR, IS-OPG, and IS-OPB may be a polygonal shape having rounded corners.

Figure 11:
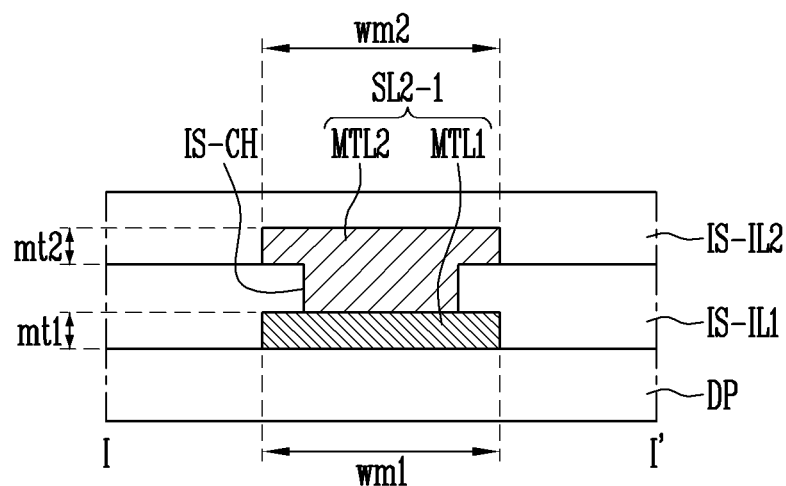
FIG. 11 is a sectional view taken along line I-I' of FIG. 10.
Figure 12:
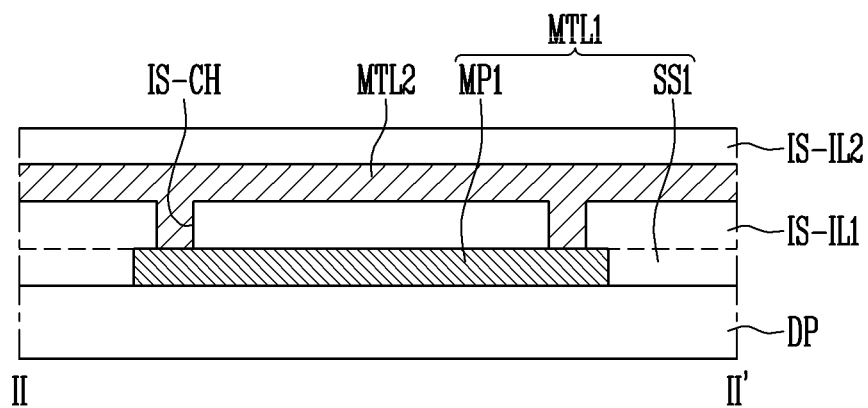
FIG. 12 is a sectional view taken along line II-II' of FIG. 10.
Figure 13A:
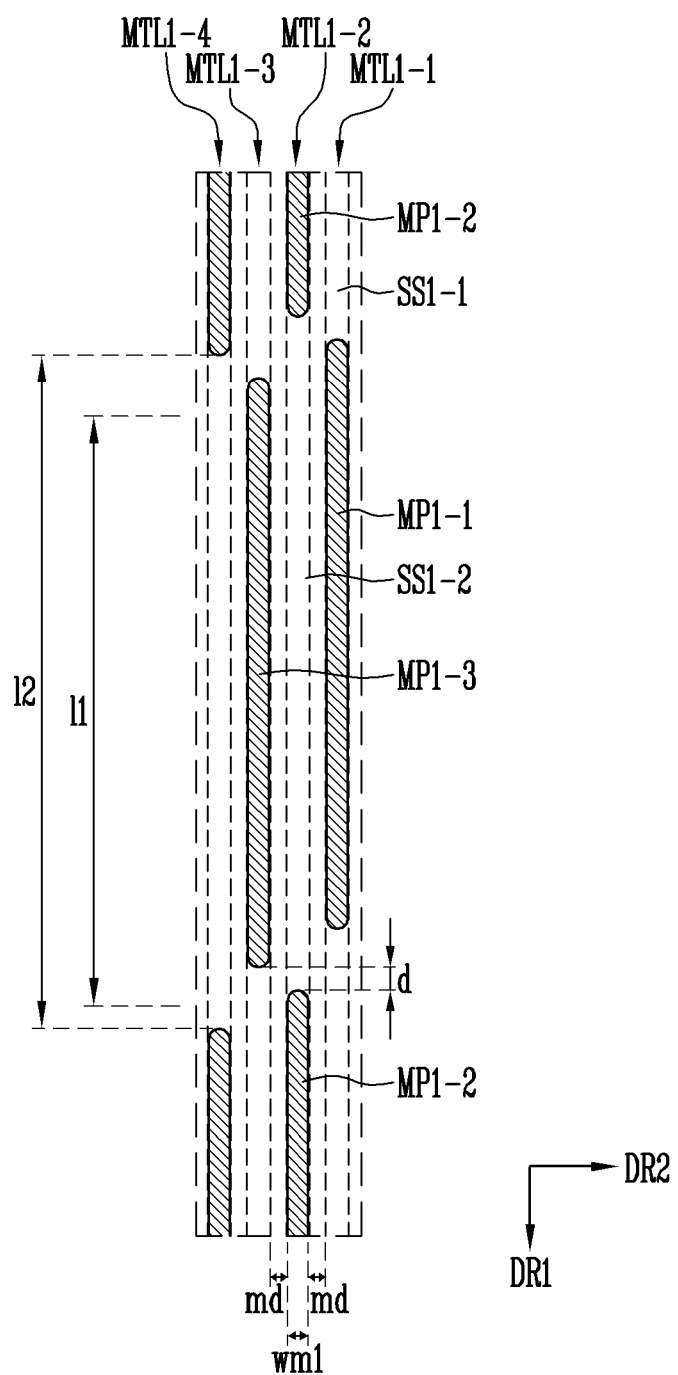
Figure 13C:
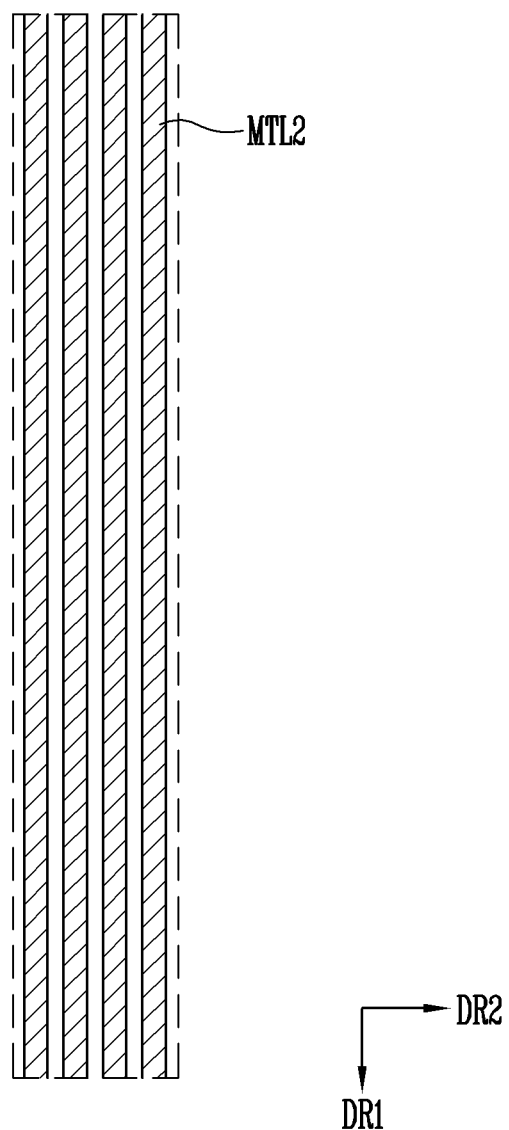

FIG. 10 is a plan view illustrating an enlargement of region FF1 of the input sensing unit shown in FIG. 8. FIG. 11 is a sectional view taken along line I-I' of FIG. 10. FIG. 12 is a sectional view taken along line II-IF of FIG. 10. FIGS. 13A to 13C are plan views illustrating respective layers of region FF1 of the input sensing unit shown in FIG. 8. In detail, FIG. 13A is a plan view illustrating a first line MTL1 provided in region FF1 of the input sensing unit shown in FIG. 8. FIG. 13B is a plan view illustrating the first insulating layer IS-IL1 which is an insulating part. FIG. 13C is a plan view illustrating a second line MTL2.

FIG. 10 is a plan view illustrating a plurality of signal lines provided in the peripheral area PA of the input sensing unit ISU.

Referring to FIGS. 8 and 10 to 13, a plurality of signal lines, that is, the first signal lines SL1-1 to SL1-5 and the second signal lines SL2-1 to SL2-4, may be provided in the peripheral area PA of the input sensing unit ISU and coupled to the sensing electrodes, i.e., the first sensing electrodes IE1-1 to IE1-5 and the second sensing electrodes IE2-1 to IE2-4, provided in the sensing area SA.

The first signal lines SL1-1 to SL1-5 and the second signal lines SL2-1 to SL2-4 may be arranged at positions spaced apart from each other in the second direction DR2 intersecting the first direction DR1 in which they extend. The first direction may a longitudinal direction (DR1 or DR2) in which each of the first and second signal lines SL1-1 to SL1-5 and SL2-1 to SL2-4 extends a predetermined length. The second direction may be a direction intersecting the longitudinal direction (DR1 or DR2) and an arrangement direction (DR2 or DR1) in which the first and second signal lines SL1-1 to SL1-5 and SL2-1 to SL2-4 are arranged.

As shown in FIG. 8, in the case where each of the first and second signal lines SL1-1 to SL1-5 and SL2-1 to SL2-4 extends in the direction DR1, the first and second signal lines SL1-1 to SL1-5 and SL2-1 to SL2-4 may be arranged at positions spaced apart from each other in the direction DR2 intersecting the direction DR1. If each of the first and second signal lines SL1-1 to SL1-5 and SL2-1 to SL2-4 extends in the direction DR2, the first and second signal lines SL1-1 to SL1-5 and SL2-1 to SL2-4 may be arranged at positions spaced apart from each other in the direction DR1 intersecting the direction DR2.

As shown in FIGS. 11 and 12, each of the first and second signal lines SL1-1 to SL1-5 and SL2-1 to SL2-4 may be formed of a first line MTL1 and a second line MTL2. The first line MTL1 and the second line MTL2 may be stacked with an insulating part IS-IL1 interposed therebetween and may be provided to overlap each other. The first line MTL1 and the second line MTL2 may be electrically coupled to each other through a contact hole IS-CH formed in the insulating part IS-IL1.

The first line MTL1 may be included in the first conductive layer IS-CL1 of FIG. 7, and the second line MTL2 may be included in the second conductive layer IS-CL2 of FIG. 7. The insulating part may be included in the first insulating layer IS-IL1 of FIG. 7.

The first line MTL1 may be formed on the thin-film encapsulation layer TFE of the display panel DP through a continuous process. After the first insulating layer IS-IL1 has been provided to cover the first line MTL1, the second line MTL2 may be provided on the first insulating layer IS-IL1.

The second line MTL2 may be provided on the first line MTL1 to overlap the first line MTL1. For example, a width wm2 of the second line MTL2 may be equal to or greater than a width wm1 of the first line MTL1. Because the width of the second line MTL2 is greater than that of the first line MTL1, a Moire phenomenon attributable to misalignment may be prevented.

In detail, if the width wm2 of the second line MTL2 disposed on the first line MTL1 is less than the width wm1 of the first line MTL1, light is reflected by the first line MTL1 and the second line MTL2, thus making both the first line MTL1 and the second line MTL2 visible. Furthermore, if the second lime MTL2 is misaligned from the first line MTL1, a Moire phenomenon may be caused.

On the other hand, in the case where the width wm2 of the second line MTL2 disposed on the first line MTL1 is equal to or greater than the width wm1 of the first line MTL1, the second line MTL2 covers the first line MTL1 in a plan view, thus preventing the first line MTL1 from being visible to the user. In addition, an alignment margin corresponding to a difference in width between the first line MTL1 and the second line MTL2 may be provided, so that occurrence of the Moire phenomenon attributable to misalignment may be mitigated.

For example, the first line MTL1 may be formed of a plurality of metal patterns MP1 disconnected from each other. In other words, the first line MTL1 may be formed of the disconnected metal patterns MP1 that are arranged at positions spaced apart from each other in the longitudinal direction thereof. The longitudinal direction of the metal patterns MP1 may be a direction in which the signal line extends.

Referring to FIGS. 8, 10, and 13A to 13C, in the case where the second signal lines SL2-1 to SL2-4 (or/and the first signal lines SL1-1 to SL1-5) extend in the direction DR1, the metal patterns MP1 of the first line MTL1 may be arranged in the direction DR1 in which the second signal lines SL2-1 to SL2-4 (or/and the first signal lines SL1-1 to SL1-5) extend.

The first line MTL1 may include the metal patterns MP1 and a spacing part SS1. The spacing part SS1 may mean a space between adjacent metal patterns MP1 provided in the first line of each signal line. In other words, the spacing part SS1 may be formed between two metal patterns MP1 arranged in the longitudinal direction of the first line MTL1. Therefore, the first line MTL1 of each of the second signal lines SL2-1 to SL2-4 (or/and the first signal lines SL1-1 to SL1-5) may be provided by alternately arranging the metal patterns MP1 and the spacing parts SS1 in the longitudinal direction.

A length l1 of each metal pattern MP1 may be less than a length l2 of the spacing part SS1 that is the space formed between the metal patterns MP1. In other words, the length l2 of the spacing part SS1 may be greater than the length l1 of the metal pattern MP1. The width of the metal pattern MP1 may be the same as that of the spacing part SS1.

Each metal pattern of one of the signal lines SL1-1 to SL1-5 (or SL2-1 to SL2-4) may not overlap the metal patterns of other signal lines adjacent to the one signal line with respect to the direction in which the signal lines SL1-1 to SL1-5 (or SL2-1 to SL2-4) are spaced apart from each other, and may overlap the corresponding spacing parts of the adjacent the signal lines.

Referring to FIG. 13A, in first lines MTL1-1, MTL1-2 that are adjacent to each other, with respect to the second direction DR2, a metal pattern MP1-1 of the first line MTL1-1 may overlap a spacing part SS1-2 of the first line MTL1-2, and may not overlap a metal pattern MP1-2 of the first line MTL1-2.

Likewise, the metal pattern MP1-2 of the first line MTL1-2 may not overlap respective metal patterns MP1-1 and MP1-3 of the first line MTL1-1 and another first line MTL1-3, and may overlap respective spacing parts SS1-1 and SS1-3 of the first lines MTL1-1 and MTL1-3.

A more detailed description will be made with reference to FIG. 13A. The first lines MTL1-1, MTL1-2, MTL1-3, and MTL1-4 may be arranged in the second direction DR2 oriented from the peripheral area PA toward the sensing area SA. The metal pattern MP1-1 of the first line MTL1-1 of the first lines MTL1-1, MTL1-2, MTL1-3, and MTL1-4 may overlap, with respect to the second direction DR2, the spacing part SS1-2 of another first line MTL1-2 disposed adjacent to the first line MTL1-1, and may not overlap the metal pattern MP1-2 of the first line MTL1-2 with respect to the second direction DR2.

Furthermore, the metal pattern MP1-2 of the first line MTL1-2 may overlap, with respect to the second direction DR2, the respective spacing parts SS1-1 and SS1-3 of the first lines MTL1-1 and MTL1-3 that are disposed on opposite sides of the first line MTL1-2, and may not overlap the metal patterns MP1-1 and MP1-3 of the first lines MTL1-1 and MTL1-3 with respect to the second direction DR2.

In other words, in the first direction DR1, the spacing parts SS1-2 may be disposed on opposite sides of the metal pattern MP1-2. In the second direction DR2, the spacing parts SS1-1 and SS1-3 of other first lines MTL1-1 and MTL1-3 may be disposed on opposite sides of the metal pattern MP1-2. Hence, the metal pattern MP1-2 may be enclosed by the spacing parts SS1-1, SS1-2, and SS1-3.

As such, the metal pattern MP1-2 may be adjacent to the spacing parts SS1-1, SS1-2, and SS1-3 at upper and lower positions in the first direction DR1 and at left and right sides in the second direction DR2, rather than being adjacent to other metal patterns.

With respect to the second direction DR2 intersecting the longitudinal direction DR1, at least a portion of the metal pattern MP1-2 of the first line MTL1-2 may overlap a metal pattern MP1-4 of the first line MTL1-4 disposed adjacent to the first line MTL1-3 neighboring the first line MTL1-2.

With respect to the arrangement direction DR2, the metal pattern MP1-1 of the first line MTL1-1 may overlap the spacing part SS1-2 of another first line MTL1-2 adjacent to the first line MTL1-1. The spacing part SS1-2 of the first line MTL1-2 may overlap the metal pattern MP1-3 of another first line MTL1-3 disposed adjacent to one side of the first line MTL1-2. The metal pattern MP1-3 of the first line MTL1-3 may overlap a spacing part SS1-4 of another first line MTL1-4 disposed adjacent to one side of the first line MTL1-3.

More generally, in the case where n signal lines extend in the first direction and are arranged in the second direction intersecting the first direction, a metal pattern included in a first line of a k-th signal line may overlap, with respect to the second direction, both a spacing part of a first line of a k−1-th signal line disposed adjacent to a first side thereof and a spacing part of a first line of a k+1-th signal line disposed adjacent to a second side thereof.

Furthermore, the metal pattern included in the first line of the k-th signal line may at least partially overlap, with respect to the arrangement direction, both a metal pattern of a first line of a k−2-th signal line at the first side thereof and a metal pattern of a first line of a k+2-th signal line at the second side thereof.

The metal pattern of the k-th first line of the first lines may be disposed at a position spaced apart from the metal pattern of the first line of the k+2-th signal line by a distance greater than the width wm1 of the spacing part of the first line of the k+1-th first line. With respect to the second direction, the distance between the metal pattern of the k-th first line and the metal pattern of the k+2-th first line may be the same as the sum of two times a distance md between the adjacent signal lines and the width wm1 of the spacing part of the first line.

As such, the first line MTL1 of the signal line is formed of the metal pattern MP1 and the spacing part SS1, and the metal pattern MP1 overlaps the spacing part of an adjacent first line without overlapping the metal pattern of the adjacent first line. Therefore, the risk of a defective wiring problem that may be caused by a foreign substance may be reduced. In other words, the distance between adjacent metal patterns that are closest to each other with respect to the arrangement direction (the second direction) is the same as the sum of two times the distance md between the adjacent first lines and the width wm1 of the spacing part of the first line. Because the distance between adjacent metal patterns is greater than the distance md between the adjacent first lines, a short circuit between the signal lines may be prevented from being caused by a foreign substance that is greater than the distance md between the adjacent first lines and smaller than the sum of two times the distance md between the adjacent first lines and the width wm1 of the spacing part of the first line.

In a display without a bezel, not only the width of each signal line but also the distance between adjacent signal lines becomes very small. The probability of a short circuit occurring between the signal lines due to a foreign substance may be increased by a reduction in the width of each signal line and a reduction in the distance between the adjacent signal lines.

In detail, foreign substances, e.g., metal particles, having various sizes may be present in a chamber in which the signal lines are formed. Among the foreign substances, foreign substances larger than the distance between the adjacent signal lines may be located at positions at which the signal lines are formed, thus causing a short circuit failure between the signal lines. Particularly, as the width of each signal line and the distance between adjacent signal lines are reduced, the range in the size of a foreign substance capable of causing a short circuit failure is increased, so that a short circuit failure rate due to foreign substances may be further increased.

In an exemplary embodiment of the inventive concepts, the first line of each signal line may be formed of a metal pattern and a spacing part, and the spacing part of another signal line may be disposed between the metal pattern and a proximate metal pattern of yet another signal line. Therefore, the distance between the metal patterns may be greater than the distance between the adjacent signal lines, whereby the short circuit failure rate of the signal lines due to foreign substances may be markedly reduced.

The metal pattern may have a rounded end. Since the one end of the metal pattern has a round shape, electric field concentration on the one end may be mitigated. Thereby, dielectric breakdown due to the electric field concentration may be reduced.

After the first lines MTL1 each of which is formed of the metal pattern MP1 and the spacing part SS1 have been formed and arranged in the second direction DR2, an insulating part may be formed to cover the first lines MTL1, as shown in FIG. 13B. The insulating part may be included in the first insulating layer IS-IL1 of FIG. 7.

The insulating part may have contact holes IS-CH. The first line MTL1 and the second line MTL2 that are stacked with the insulating part interposed therebetween may be electrically coupled to each other through the contact holes IS-CH. The contact holes IS-CH may be formed at positions adjacent to the respective opposite ends of the metal pattern MP1 of the first line MTL1.

Referring to FIGS. 11, 12, 13A, and 13C, a second line MTL2 may be provided on the insulating part IS-IL1 to overlap the first line MTL1. The second line MTL2 may be a conductive line having an integrated structure. The second line MTL2 may be electrically coupled to the first line MTL1 through the contact holes SL-CH that are formed in the insulating part IS-IL1 at positions corresponding to the metal pattern MP1 of the first line MTL1.

The width of the second line MTL2 may be equal to or greater than the width wm1 of the metal pattern MP1 of the first line MTL1. When the input sensing unit ISU is shown in a plan view, the second line MTL2 covers the first line MTL1, so that the metal pattern MP1 of the of the first line MTL1 may be invisible.

A thickness mt2 of the second line MTL2 may be equal to or greater than a thickness mt1 of the metal pattern MP1 of the first line MTL1. The metal pattern MP1 of the first line MTL1 may be formed of a plurality of metal layers. In the case where metals forming the metal pattern MP1 have different etching rates, a metal layer having a comparatively low etching rate may have a side surface protruding further than that of a metal layer having a comparatively high etching rate. The protruding portion of the metal layer having the low etching rate may form an opening in the insulating part that covers the first line MTL1. Because of the opening in the insulating part, a short circuit of the first and second lines MTL1 and MTL2 may be caused.

In an exemplary embodiment of the inventive concepts, the thickness mt1 of the metal pattern MP1 of the first line MTL1 may be less than the thickness mt2 of the second line MTL2. In this case, compared to the case where the thickness mt1 of the metal pattern MP1 of the first line MTL1 is the same as the thickness mt2 of the second line MTL2, the thickness of the insulating part on the metal pattern MP1 of the first line MTL1 may be increased. Thereby, the probability of a short circuit occurring between the first line MTL1 and the second line MTL2 due to the opening formed in the insulating part may be reduced.

Although not shown, if the first signal lines SL1-1 to SL1-5 and the second signal lines SL2-1 to SL2-4 have different lengths, the width of a comparatively long signal line may be greater than that of a comparatively short signal line.

The first signal lines SL1-1 to SL1-5 and the second signal lines SL2-1 to SL2-4 may be provided in the peripheral area PA of the input sensing unit ISU and extend from the second sensing electrodes IE2-1 to IE2-4 toward the pad area NDA-PD in the first direction DR1 of the input sensing unit ISU.

In particular, the widths of the second signal lines SL2-1 to SL2-4 may differ from each other. For example, the width of the 2-4-th signal line SL2-4 that is closest to the sensing area SA may be comparatively small, and the width of the 2-1-th signal line SL2-1 that is farthest from the sensing area SA may be comparatively large. In other words, the closer it is to the sensing area SA, the smaller the width of each of the second signal lines SL2-1 to SL2-4 may be.

Since the second signal lines SL2-1 to SL2-4 have different widths, the respective resistances of the second signal lines SL2-1 to SL2-4 may be uniform. In detail, the 2-1-th signal line SL2-1 may be disposed in the outermost portion of the peripheral area PA that is farthest from the sensing area SA and may be coupled to the second sensing electrodes IE2-1 that are disposed in a column farthest from the pad part SL-P. On the other hand, the 2-4-th signal line SL2-4 may be disposed in the innermost portion of the peripheral area PA that is closest from the sensing area SA and may be coupled to the second sensing electrodes IE2-4 that are disposed in a column closest to the pad part SL-P. Thus, the length of the 2-1-th signal line SL2-1 may be greater than that of the 2-4-th signal line SL2-4.

Generally, the resistance of a line may be proportional to the length of the line. In the case where the 2-1-th signal line SL2-1 and the 2-4-th signal line SL2-4 have the same width, the resistance of the 2-1-th signal line SL2-1 that is comparatively long may be greater than that of the 2-4-th signal line SL2-4 that is comparatively short. A difference in resistance between the 2-1-th signal line SL2-1 and the 2-4-th signal line SL2-4 may distort a sensing input signal applied to each of the 2-1-th signal line SL2-1 and the 2-4-th signal line SL2-4. Thereby, the sensing input signal may not be uniformly provided to the overall region of the sensing area SA, whereby the touch recognition rate of the input sensing unit ISU may be reduced.

To prevent this problem, in an exemplary embodiment of the inventive concepts, the second signal lines SL2-1 to SL2-4 (or/and the first signal lines SL1-1 to SL1-5) may be designed to have different widths so that the second signal lines SL2-1 to SL2-4 (or/and the first signal lines SL1-1 to SL1-5) may have a uniform resistance, thus enhancing the touch recognition rate.

Figure 14:
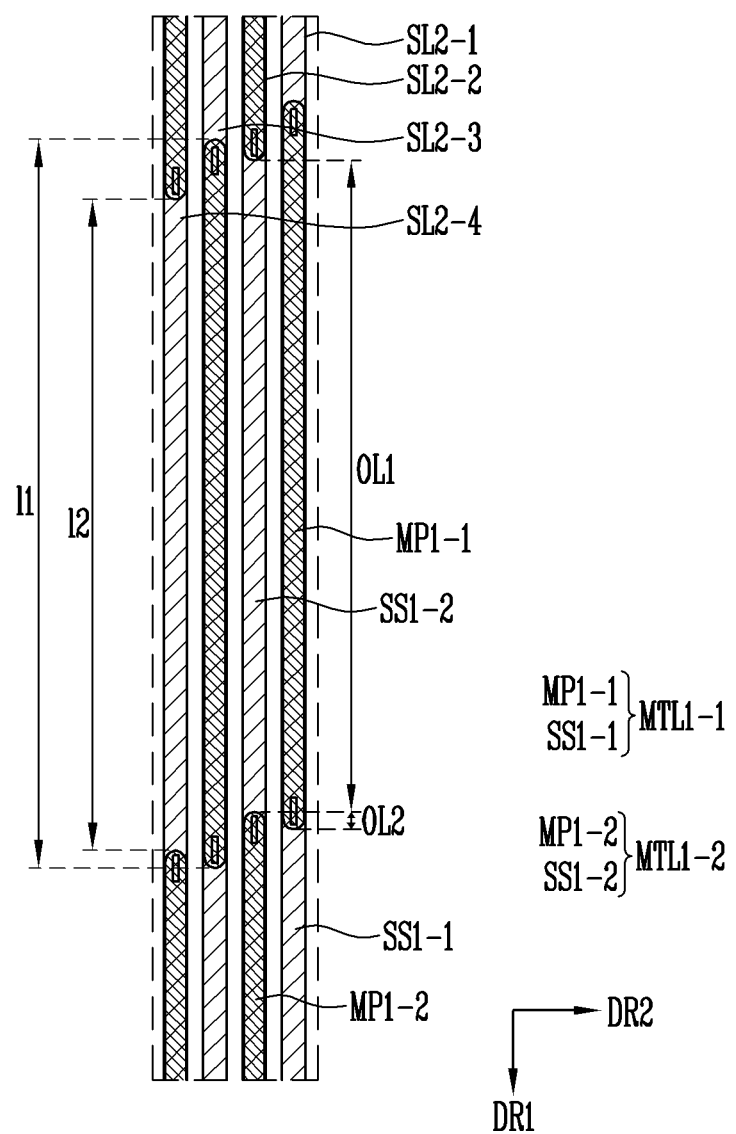
FIG. 14 is a plan view illustrating signal lines of the input sensing unit in accordance with an exemplary embodiment of the inventive concepts.

FIG. 14 is a plan view illustrating signal lines SL2-1 to SL2-4 of the input sensing unit ISU in accordance with an exemplary embodiment of the inventive concepts.

Referring to FIG. 14, with respect to the second direction DR2 in which the signal lines SL2-1 to SL2-4 are arranged and spaced apart from each other, a metal pattern of one of the signal lines SL2-1 to SL2-4 may partially overlap a metal pattern of another signal line adjacent to the one signal line and overlap a corresponding spacing part of the adjacent signal line. The spacing part SS1-1, SS1-2 may mean a space between metal patterns of the signal line.

In the case where, with respect to the second direction DR2 in which the signal lines are arranged and spaced apart from each other, a metal pattern of one of the signal lines partially overlaps a metal pattern of another signal line adjacent to the one signal line and a corresponding spacing part of the adjacent signal line, a length by which the metal pattern of the one signal line overlaps the metal pattern of the adjacent signal line may be less than a length by which the metal pattern of the one signal line overlaps the spacing part of the adjacent signal line.

Referring to FIG. 14, with respect to the second direction DR2 in which the second signal lines SL2-1 to SL2-4 (or/and the first signal lines SL1-1 to SL1-5) are arranged, a metal pattern MP1-1 included in a first line MTL1-1 of one of the second signal lines SL2-1 to SL2-4 (or/and the first signal lines SL1-1 to SL1-5) may partially overlap a metal pattern MP1-2 included in a first line MTL1-2 of another signal line that is adjacent to the one signal line in the second direction DR2, and may also partially overlap a spacing part SS1-2 of the adjacent signal line.

The length by which the metal pattern MP1-1 included in the first line MTL1-1 of one signal line overlaps the spacing part SS1-2 included in the first line MTL1-2 of the adjacent signal line may be greater than the length by which the metal pattern MP1-1 overlaps the metal pattern MP1-2 included in the first line MTL1-2 of the adjacent signal line.

In detail, with respect to the second direction DR2, the metal pattern MP1-1 included in the first line MTL1-1 of the second signal line SL2-1 of the second signal lines SL2-1 to SL2-4 may partially overlap one end of the metal pattern MP1-2 included in the first line MTL1-2 of the second signal line SL2-2 adjacent to the second signal line SL2-1, and may also overlap the spacing part SS1-2 included in the first line MTL1 of the second signal line SL2-2.

A portion OL1 in which the metal pattern MP1-1 included in the first line MTL1-1 of the second signal line SL2-1 overlaps the spacing part SS2-2 included in the first line MTL1-2 of the second signal line SL2-2 adjacent to the second signal line SL2-1 may be greater in length than a portion OL2 in which the metal pattern MP1-1 included in the first line MTL1-1 of the second signal line SL2-1 overlaps the metal pattern MP1-2 included in the first line MTL1-2 of the second signal line SL2-2 adjacent to the second signal line SL2-1.

A length l1 of each metal pattern MP1-1, MP1-2 may be greater than a length l2 of the spacing part SS1 formed between the metal patterns MP1-1 and MP1-2. In other words, the length l2 of the spacing part SS1 may be less than the length l1 of the metal pattern MP1.

The width of the metal pattern MP1 may be the same as that of the spacing part SS1.

As such, the first line MTL1 of the signal line is formed of the metal pattern MP1 and the spacing part SS1, and the metal pattern MP1 partially overlaps the metal pattern of an adjacent first line and also overlaps the spacing part of the adjacent first line. Therefore, the risk of a defective wiring problem that may be caused by a foreign substance may be reduced. In detail, the distance between metal patterns that are closest to each other with respect to the arrangement direction is similar to the sum of two times the distance between the adjacent first lines and the width of the spacing part of the first line and is thus greater than the distance between adjacent first lines. Therefore, a short circuit between the signal lines may be prevented from being caused by a foreign substance that is greater than the distance between the adjacent first lines and smaller than the sum of two times the distance and between the adjacent first lines and the width of the spacing part of the first line.

Figure 15:
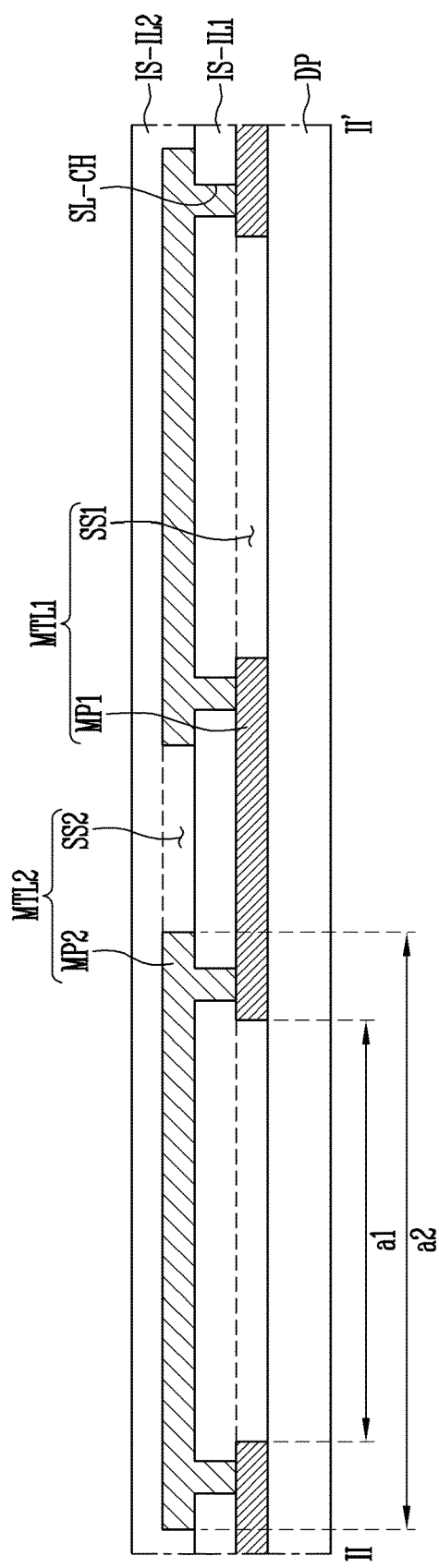
FIG. 15 is a sectional view illustrating signal lines of the input sensing unit in accordance with an exemplary embodiment of the inventive concepts.

FIG. 15 is a sectional view illustrating signal lines of the input sensing unit ISU in accordance with an exemplary embodiment of the inventive concepts.

The signal lines of the input sensing unit ISU shown in FIG. 15 may differ from the signal lines of the input sensing unit ISU shown in FIG. 10 or 14 in that each second line MTL2 thereof includes a metal pattern MP2 and a spacing part SS2. In detail, the signal lines of the input sensing unit ISU shown in FIG. 15 are the same as the signal lines of the input sensing unit ISU shown in FIG. 10 or 14 in that each signal line is formed of a first line MTL1 and a second line MTL2, and the first line MTL1 is formed of a metal pattern and a spacing part. However, unlike the signal lines of the input sensing unit ISU shown in FIG. 10 or 14 in which the second line is formed of an integrated metal line, each second line MTL2 of the signal lines of the input sensing unit ISU shown in FIG. 15 may be formed of a metal pattern MP2 and a spacing part SS2.

The second line MTL2 may be formed of disconnected metal patterns MP2 that are spaced apart from each other. In other words, the second line MTL2 may include the metal patterns MP2 and the spacing part SS2.

When the input sensing unit ISU is shown in a plan view, each metal pattern MP2 of the second line MTL2 may overlap the corresponding metal patterns MP1 of the first line MTL1 that are spaced apart from each other. The portions of the metal pattern MP2 that overlap the metal patterns MP1 of the first line MTL1 may be electrically coupled to the first line MTL1 through the contact holes SL-CH of the insulating part IS-IL1.

A length a2 of each metal pattern MP2 of the second line MTL2 may be greater than a length a1 of the spacing part SS1, i.e., the space between the metal patterns MP1 of the first line MTL1. The metal pattern MP2 of the second line MTL2 may be provided over the corresponding spacing part SS1 of the first line MTL1, and be electrically coupled to the two corresponding metal patterns MP1 provided in the first line MTL1 with the spacing part SS1 interposed therebetween, through the contact holes SL-CH that are formed in the insulating part IS-IL1 at positions corresponding to respective associated ends of the two metal patterns MP1.

The first line MTL1 is formed earlier than the second line MTL2 in the chamber in which the signal lines are formed. Due both to foreign substances that have been present in the chamber before the first line MTL1 is formed and to foreign substances generated when the first line MTL1 is formed, a failure rate of the first line MTL1 due to foreign substances may be higher than that of the second line MTL2. A short circuit failure due to a foreign substance may also be caused in the second line MTL2 although the occurrence frequency thereof is lower than that of the first line MTL1.

In the exemplary embodiment shown in FIG. 15, similar to the first line MTL1, each second line MTL2 also includes the metal pattern MP2 and the spacing part SS2. A spacing part SS2 of another signal line may be provided between the metal pattern MP2 of the second line MTL2 and a proximate metal pattern MP2 of yet another signal line. Therefore, the distance between the adjacent metal patterns may be greater than the distance between adjacent signal lines, whereby a short circuit failure rate due to a foreign substance may be markedly reduced.

Figure 16:
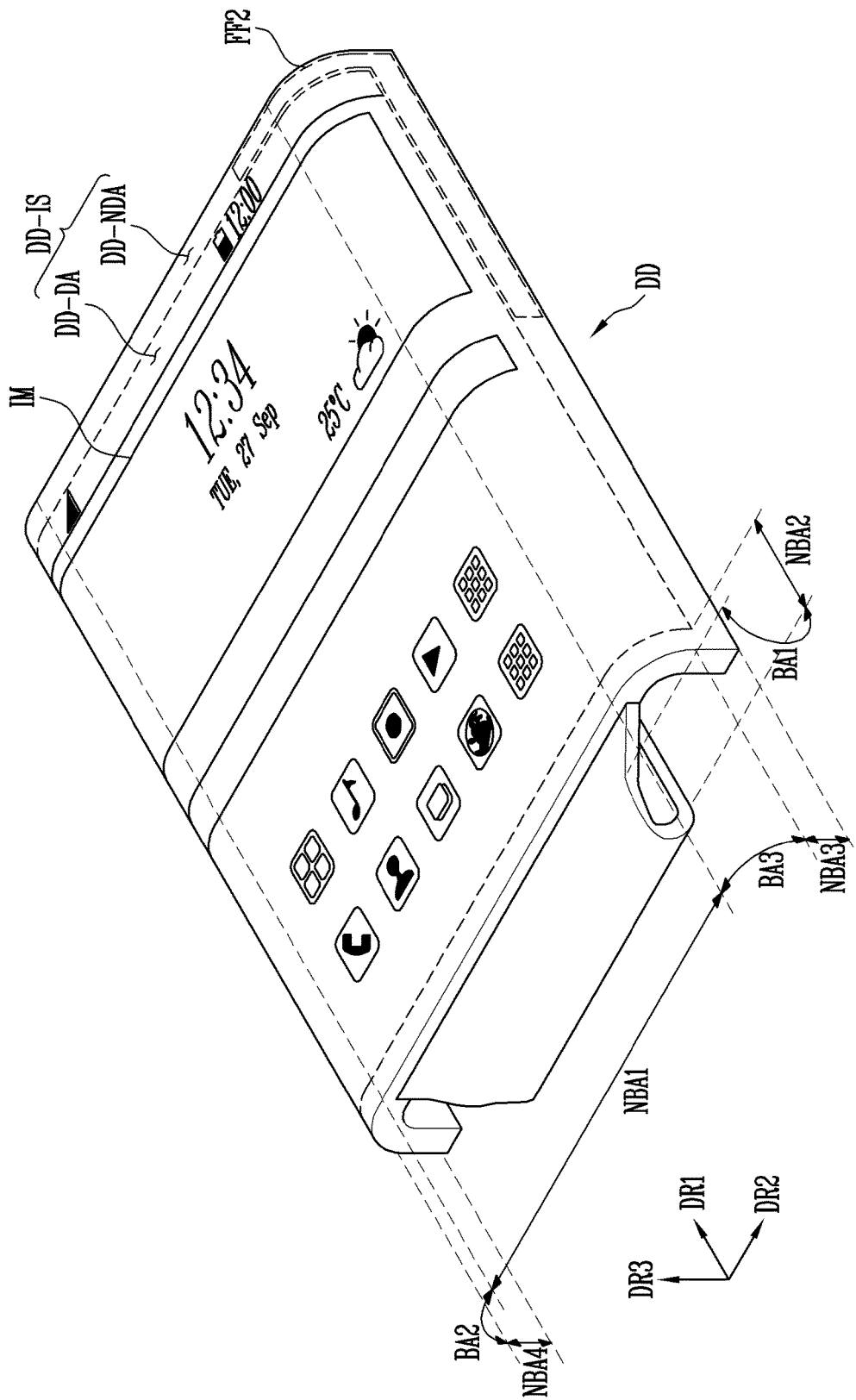
FIG. 16 is a perspective view illustrating a display device in accordance with an exemplary embodiment of the inventive concepts.
Figure 17:
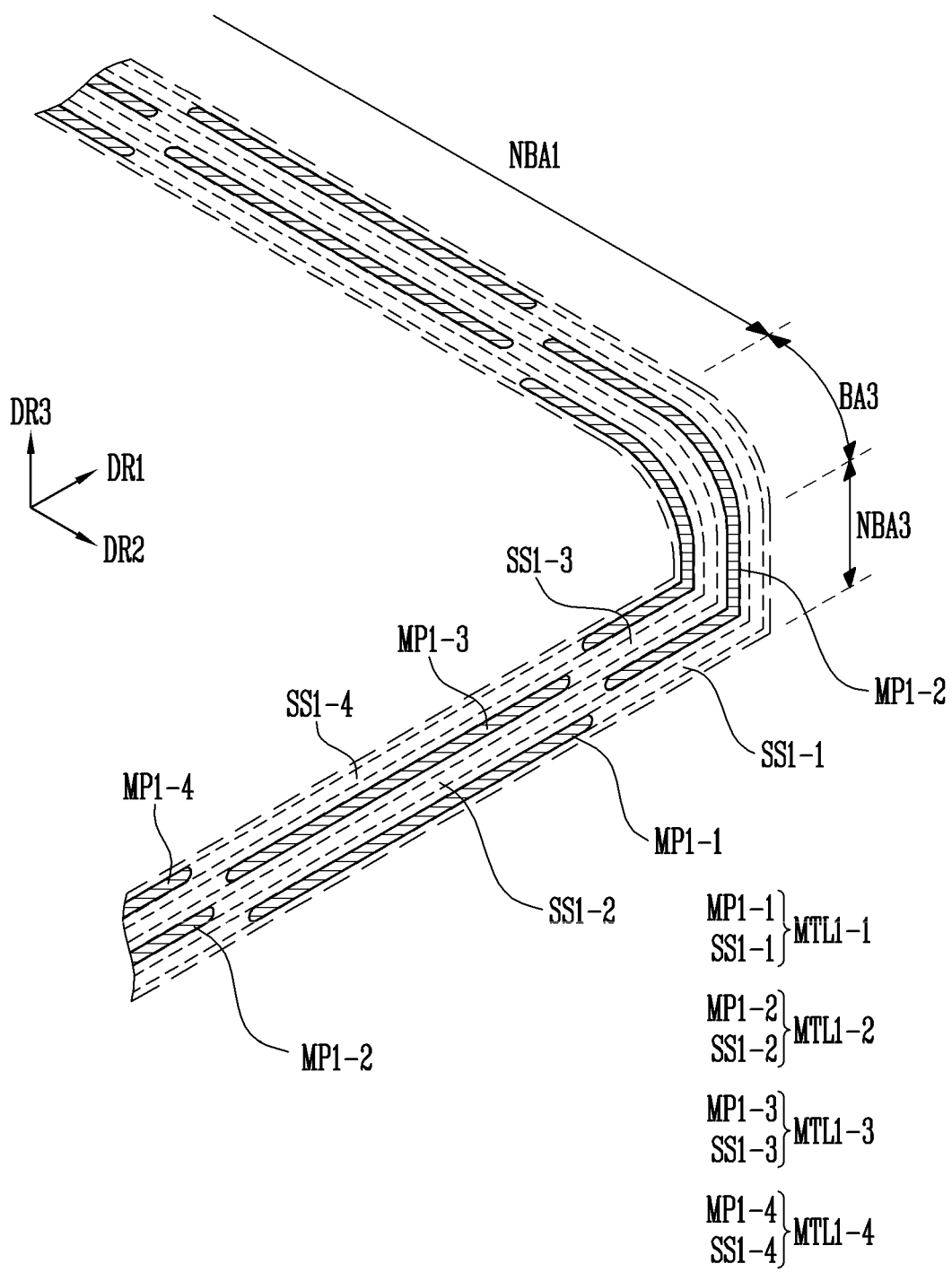
FIG. 17 is a plan view illustrating an enlargement of region FF2 shown in FIG. 16.

FIG. 16 is a perspective view illustrating a display device in accordance with an embodiment of the present disclosure, and FIG. 17 is an enlarged plan view of region FF2 shown in FIG. 16.

Referring to FIG. 16, the display device DD in accordance with an exemplary embodiment may include a first non-bent area NBA1, a second non-bent area NBA2, a third non-bent area 3, a fourth non-bent area NBA4, a first bent area BA1, a second bent area BA2, and a third bent area BA3. The first non-bent area NBA1, the second non-bent area NBA2, the third non-bent area 3, the fourth non-bent area NBA4, the first bent area BA1, the second bent area BA2, and the third bent area BA3 may be set based on the display panel DP (refer to FIG. 2).

The display panel DP may have areas having various widths with respect to the first direction DR1. The first bending area BA1 and the second non-bent area NBA2 may have a width less than that of the first non-bent area NBA1. Since the first bent area BA has a relatively small width, bent may be facilitated.

In FIG. 16, a boundary area that is gradually reduced in width may be included in the first non-bent area NBA1. In an exemplary embodiment of the inventive concepts, the boundary area that is gradually reduced in width may be omitted.

The second non-bent area NBA2 may include a pad area NDA-PD (refer to FIG. 4). When the display device is in a bent state, as shown in FIG. 16, the second non-bent area NBA2 may face the first non-bent area NBA1 and be spaced apart from the first non-bent area NBA1.

Two edge areas of the first non-bent area NBA1 that face away from each other in the second direction DR2 may be bent from a central area of the first non-bent area NBA1, thus respectively defining the second and third bent areas BA2 and BA3. Each of the second and third bent areas BA2 and BA3 may have a predetermined curvature.

The third and fourth non-bent areas NBA3 and NBA4 may be respectively defined on outer edges of the second and third bent areas BA2 and BA3.

The input sensing unit ISU, the reflection prevention unit RPU, and the window unit WU that are shown in FIG. 2 may overlap the first non-bent area NBA1, the second bent area BA2, the third bent area BA3, the third non-bent area NBA3, and the fourth non-bent area BA4.

In the caser where the input sensing unit ISU overlaps the first non-bent area NBA1, the second bent area BA2, the third bent area BA3, the third non-bent area NBA3, and fourth non-bent area BA4 of the display device DD, the input sensing unit ISU may include bent parts BU1 and BU2 that are respectively provided on the second and third bent areas BA2 and BA3 and have predetermined curvatures along the second and third bent areas BA2 and BA3.

A metal pattern of each of signal lines SL2-1 to SL2-4 disposed on the bent parts BU1 and BU2 may overlap a metal pattern of another signal line adjacent thereto disposed on the bent part BU1 or BU2 in a direction in which the signal lines are arranged on the bent parts BU1 and BU2 and spaced apart from each other, and may not overlap a spacing part formed between metal patterns of the adjacent signal line. In an embodiment, each of the signal lines of the input sensing unit ISU that are disposed on the bent parts BU1 and BU2 may be formed of only a metal pattern without including a spacing part.

Referring to FIG. 17, the second signal lines SL2-1 to SL2-4 may extend in the direction DR1 on the input sensing unit ISU at a position corresponding to the fourth non-bent area BA4. With regard to the second signal lines SL2-1 to SL2-4 on the area corresponding to the fourth non-bent area BA4, the first lines MTL1-1 to MTL1-4 may be formed of metal patterns MP1-1 to MP1-4 and spacing parts SS1-1 to SS1-4, respectively.

At a position corresponding to the third bent area BA3 (or the second bent area BA2), each of the second signal lines SL2-1 to SL2-4 may include only one of the spacing part and the metal pattern. For example, in the third bent area BA3 (or the second bent area BA2), the first lines MTL1-2 and MTL1-4 of the second signal lines SL2-1 to SL2-4 may be respectively formed of only metal patterns MP1-2 and MP1-4 without including spacing parts SS1-2 and SS1-4, and the first lines MT1-1 and MTL1-3 may be respectively formed of only spacing parts SS1-1 and SS1-3 without including metal patterns MP1-1 and MP1-3.

If each signal line includes both a metal pattern and a spacing part in the bent part, a crack may be generated from a boundary between the spacing part and the metal pattern in the bent part during a bending process.

As such, in an exemplary embodiment, each of the signal lines may be formed of only the metal pattern or only the spacing part at a position corresponding to the bent part, whereby a crack may be prevented from being generated during a bending process.

With regard to the second signal lines SL2-1 to SL2-4 on the area out of the third bent area BA3, the first lines MTL1-1 to MTL1-4 may include both the metal patterns MP1-1 to MP1-4 and the spacing parts SS1-1 to SS1-4, respectively.

Various exemplary embodiments of the inventive concepts may provide an input sensing unit having improved reliability, and a display device having the input sensing unit.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An input sensing unit comprising:
   sensing electrodes; and
   a plurality of signal lines provided in the peripheral area of the input sensing unit coupled to the sensing electrodes and spaced apart from each other,
   wherein each of the plurality of signal lines comprises disconnected metal patterns separated by insulated spacing parts and arranged in a straight line in a direction in which the signal lines extend, intersecting another direction in which the signal lines are arranged and spaced apart from each other, and
   wherein each of the metal patterns of one signal line of the plurality of signal lines laterally overlaps the spacing part between metal patterns of another signal line adjacent to the one signal line in the another direction in which the signal lines are arranged and spaced apart from each other, and is offset from the spacing part in the direction in which the signal lines extend.

2. The input sensing unit according to claim 1, wherein each metal pattern of the one signal line does not overlap a metal pattern of the adjacent signal line in the another direction in which the signal lines are arranged and spaced apart from each other, and overlaps the spacing part of the adjacent signal line.

3. The input sensing unit according to claim 1, wherein each metal pattern of the one signal line partially overlaps a metal pattern of the adjacent signal line in the another direction in which the signal lines are arranged and spaced apart from each other, and overlaps the spacing part of the adjacent signal line.

4. The input sensing unit according to claim 3, wherein, a portion of the metal pattern of the one signal line that overlaps the metal pattern of the adjacent signal line is smaller than a portion of the metal pattern of the one signal line that overlaps the spacing part of the adjacent signal line.

5. The input sensing unit according to claim 1, wherein a length of each of the metal patterns is equal to or greater than a length of the spacing part between the metal patterns.

6. The input sensing unit according to claim 1, wherein a length of each of the metal patterns is less than a length of the spacing part between the metal patterns.

7. The input sensing unit according to claim 1, wherein each of the metal patterns has a rounded end.

8. The input sensing unit according to claim 1, wherein a width of a longer one of the signal lines is greater than a width of a shorter one of the signal lines.

9. The input sensing unit according to claim 1, further comprising a bent part having a predetermined curvature in at least a portion thereof,
   wherein each of the signal lines disposed in the bent part is formed of only a metal pattern or only a spacing part so that only one of the metal pattern and the spacing part of each of the signal lines is provided in the bent part.

10. The input sensing unit according to claim 1, further comprising an insulating part,
    wherein each of the signal lines comprises a first line and a second line disposed to overlap each other with the insulating part interposed therebetween.

11. The input sensing unit according to claim 10, wherein the second line comprises a conductive line having an integrated structure and is electrically coupled to the first line through a contact hole that is formed in the insulating part at a position at which the second line overlaps a metal pattern of the first line.

12. The input sensing unit according to claim 11, wherein the contact hole is formed adjacent to an end of the metal pattern.

13. The input sensing unit according to claim 10, wherein:
    the second line comprises metal patterns spaced apart from each other; and
    each of the metal patterns of the second line overlaps corresponding spaced metal patterns of the first line and is electrically coupled to the first line through contact holes of the insulating part at positions at which the metal patterns of the second line overlap the metal patterns of the first line.

14. The input sensing unit according to claim 10, wherein a metal pattern of the second line is longer than a spacing part formed between the metal patterns of the first line.

15. The input sensing unit according to claim 10, wherein:
the second line is disposed over the first line; and
a thickness of a metal pattern of the second line is greater than a thickness of a metal pattern of the first line.

16. The input sensing unit according to claim 1, wherein each of the sensing electrodes comprises a mesh pattern.

17. The input sensing unit according to claim 16, wherein:
the sensing electrode comprises:
a first sensing electrode extending in a first direction; and
a second sensing electrode extending in a second direction intersecting the first direction;
the first sensing electrode comprises a plurality of first sensors arranged in the first direction, and a first connector coupling the first sensors to each other;
the second sensing electrode comprises a plurality of second sensors arranged in the second direction, and a second connector coupling the second sensors to each other;
the first sensors and the second sensors are disposed on the same layer or different layers; and
one of the first connectors and the second connectors is disposed on the same layer with the first sensors.

18. A display device comprising:
a display panel including a display area and a non-display area adjacent to the display area; and
an input sensing unit provided on the display panel, wherein:
the input sensing unit comprises:
sensing electrodes; and
a plurality of signal lines provided in the peripheral area of the input sensing unit coupled to the sensing electrodes and spaced apart from each other;
each of the plurality of signal lines comprises disconnected metal patterns separated by insulated spacing parts and arranged in a straight line in a direction in which the signal lines extend, intersecting another direction in which the signal lines are arranged and spaced apart from each other; and
each of the metal patterns of one signal line of the plurality of signal lines laterally overlaps the spacing part between metal patterns of another signal line adjacent to the one signal line in the another direction in which the signal lines are arranged and spaced apart from each other, and is offset from the spacing part in the direction in which the signal lines extend.

19. The display device according to claim 18, wherein the display panel comprises:
a base layer;
a light-emitting element provided over the base layer; and
an encapsulation layer covering the light-emitting element and comprising one or more layers.

20. The input sensing unit according to claim 18, wherein each metal pattern of the one signal line does not overlap a metal pattern of the adjacent signal line in the another direction in which the signal lines are arranged and spaced apart from each other, and overlaps the spacing part of the adjacent signal line.

21. The input sensing unit according to claim 18, wherein each metal pattern of the one signal line partially overlaps a metal pattern of the adjacent signal line in the another direction in which the signal lines are arranged and spaced apart from each other, and overlaps the spacing part of the adjacent signal line.

22. The input sensing unit according to claim 21, wherein, a portion of the metal pattern of the one signal line that overlaps the metal pattern of the adjacent signal line is smaller than a portion of the metal pattern of the one signal line that overlaps the spacing part of the adjacent signal line.

23. The display device according to claim 18, wherein a length of each of the metal patterns is greater than a length of the spacing part between the metal patterns.

24. The display device according to claim 18, wherein a length of each of the metal patterns is equal to or less than a length of the spacing part between the metal patterns.

25. The display device according to claim 18, wherein each of the metal patterns has a rounded end.

26. The display device according to claim 18, wherein a width of a longer one of the signal lines is greater than a width of a shorter one of the signal lines.

27. The display device according to claim 18, further comprising a bent part having a predetermined curvature in at least a portion thereof,
wherein each of the signal lines disposed in the bent part is formed of only a metal pattern or only a spacing part so that only one of the metal pattern and the spacing part of each of the signal lines is provided in the bent part.

28. The display device according to claim 18, further comprising an insulating part,
wherein each of the signal lines comprises a first line and a second line overlapping each other with the insulating part interposed therebetween.

29. The display device according to claim 28, wherein the second line comprises a conductive line having an integrated structure and is electrically coupled to the first line through a contact hole formed in the insulating part at a position at which the second line overlaps a metal pattern of the first line.

30. The input sensing unit according to claim 28, wherein:
the second line comprises metal patterns spaced apart from each other; and
each of the metal patterns of the second line overlaps corresponding spaced metal patterns of the first line and is electrically coupled to the first line through contact holes of the insulating part at positions at which the metal patterns of the second line overlap the metal patterns of the first line.

31. The input sensing unit according to claim 30, wherein a metal pattern of the second line is longer than a spacing part formed between the metal patterns of the first line.

32. The display device according to claim 30, wherein the contact hole is formed adjacent to an end of the metal pattern.

33. The display device according to claim 28, wherein:
the second line is disposed over the first line; and
a thickness of a metal pattern of the second line is greater than a thickness of a metal pattern of the first line.

34. The display device according to claim 18, wherein each of the sensing electrodes comprises a mesh pattern.

35. The display device according to claim 34, wherein the sensing electrode comprises:
a first sensing electrode extending in a first direction; and
a second sensing electrode extending in a second direction intersecting the first direction, wherein:
the first sensing electrode comprises a plurality of first sensors arranged in the first direction, and a first connector coupling the first sensors to each other;
the second sensing electrode comprises a plurality of second sensors arranged in the second direction, and a second connector coupling the second sensors to each other;
the first sensors and the second sensors are disposed on the same layer or different layers; and
one of the first connectors and the second connectors is disposed on the same layer with the first sensors.

36. An input sensing unit provided on a display panel, the input sensing unit comprising:
a sensing electrode;
a signal line provided in the peripheral area of the input sensing unit coupled to the sensing electrode; and
an insulating part disposed over the display panel and overlapping the display panel,
wherein:
the signal line comprises at least two line parts, each of which comprises a first line and a second line with an insulating part interposed therebetween, the first and second line being electrically coupled to each other through a contact hole of the insulating part;
each of the line parts extends in a first direction, and the line parts adjacent to each other are arranged and spaced apart from each other in a second direction intersecting the first direction;
each of the line parts comprises disconnected metal patterns oriented in the first direction, and an insulated spacing part suitable for spacing the adjacent metal patterns apart from each other in the first direction and arranged in a straight line together with the metal patterns; and
each of the metal patterns at least partially laterally overlaps the spacing part of a line part that is adjacent, in the second direction, to the line part including the metal pattern, and is offset from the spacing part in the first direction.

\* \* \* \* \*